(12) United States Patent
Nakai et al.

(10) Patent No.: US 7,875,115 B2
(45) Date of Patent: Jan. 25, 2011

(54) EPITAXIAL WAFER AND METHOD FOR PRODUCING EPITAXIAL WAFERS

(75) Inventors: Katsuhiko Nakai, Yamaguchi (JP); Koji Fukuhara, Yamaguchi (JP)

(73) Assignee: Siltronic AG, Munich (DE)

( * ) Notice: Subject to any disclaimer, the term of this patent is extended or adjusted under 35 U.S.C. 154(b) by 951 days.

(21) Appl. No.: 11/653,070

(22) Filed: Jan. 12, 2007

(65) Prior Publication Data
US 2007/0178668 A1 Aug. 2, 2007

Related U.S. Application Data

(63) Continuation-in-part of application No. 11/645,017, filed on Dec. 22, 2006.

(30) Foreign Application Priority Data
Jan. 12, 2006 (JP) ............................... 2006-005237

(51) Int. Cl.
C30B 19/00 (2006.01)
C30B 15/00 (2006.01)
(52) U.S. Cl. ............................ 117/13; 117/45; 117/54; 117/56
(58) Field of Classification Search .................... 117/13, 117/28, 51, 54, 45, 33
See application file for complete search history.

(56) References Cited
U.S. PATENT DOCUMENTS
5,444,246 A * 8/1995 Kitagawara et al. .... 250/339.08
5,935,320 A * 8/1999 Graef et al. .............. 117/2
(Continued)

FOREIGN PATENT DOCUMENTS
JP 10-50715 2/1998
(Continued)

OTHER PUBLICATIONS

Takahashi, Microvoid Defects in Nitrogen- and/or carbon-doped Czyochralski-grown silicon crystals, The Japan Society of Applied Physics, Feb. 2003, pp. 363-370, vol. 42, No. 2A, Part 01, Japanese journal of Applied Physics, Japan. XP001164814.
(Continued)

Primary Examiner—Robert M. Kunemund
Assistant Examiner—G. Nagesh Rao
(74) Attorney, Agent, or Firm—Leydig, Voit & Mayer, Ltd.

(57) ABSTRACT

This disclosure is aimed at providing a method for producing an epitaxial wafer allowing uniform occurrence of oxygen precipitate in a substrate plane in the radial direction in a base plate and excelling in the crystal quality of an epi-layer.

A method for the production of an epitaxial wafer, characterized by using as a substrate a base plate of nitrogen- and carbon-added silicon single crystal having a nitrogen concentration of $5 \times 10^{14}$ to $5 \times 10^{15}$ atoms/cm$^3$ and a carbon concentration of $1 \times 10^{16}$ to $1 \times 10^{18}$ atoms/cm$^3$, having a crystal growth condition during the production of silicon single crystal in a range in which the whole surface of substrate becomes an OSF region, and being pulled at a cooling speed of not less than 4° C./minute between 1100 and 1000° C. during the growth of crystal, and depositing the silicon single crystal layer on the surface of the substrate by the epitaxial method.

1 Claim, 8 Drawing Sheets

U.S. PATENT DOCUMENTS

| | | | |
|---|---|---|---|
| 6,042,646 A | 3/2000 | Ishikawa et al. | |
| 6,159,438 A * | 12/2000 | Iida et al. | 423/328.2 |
| 6,191,009 B1 * | 2/2001 | Tamatsuka et al. | 438/471 |
| 6,198,157 B1 * | 3/2001 | Ishida et al. | 257/607 |
| 6,221,156 B1 * | 4/2001 | Watanabe et al. | 117/208 |
| 6,277,501 B1 * | 8/2001 | Fujikawa | 428/641 |
| 6,364,947 B1 * | 4/2002 | Iida et al. | 117/206 |
| 6,365,461 B1 | 4/2002 | Asayama et al. | |
| 6,514,335 B1 * | 2/2003 | Egashira et al. | 117/13 |
| 6,547,875 B1 | 4/2003 | Nakajima et al. | |
| 6,548,886 B1 * | 4/2003 | Ikari et al. | 257/610 |
| 6,635,950 B1 * | 10/2003 | Ishida et al. | 257/607 |
| 6,641,888 B2 * | 11/2003 | Asayama et al. | 428/64.1 |
| 6,878,451 B2 * | 4/2005 | Asayama et al. | 428/446 |
| 7,311,888 B2 * | 12/2007 | Takeno et al. | 423/328.2 |
| 7,438,880 B2 * | 10/2008 | Hung et al. | 423/291 |
| 7,446,197 B2 * | 11/2008 | Watanabe | 546/2 |
| 7,518,187 B2 * | 4/2009 | Sakurada | 257/347 |
| 7,582,357 B2 * | 9/2009 | Koike | 428/446 |
| 7,637,997 B2 * | 12/2009 | Ono et al. | 117/15 |
| 2001/0029883 A1 * | 10/2001 | Minami et al. | 117/20 |
| 2002/0000189 A1 | 1/2002 | Tanaka et al. | |
| 2002/0142170 A1 * | 10/2002 | Asayama et al. | 428/446 |
| 2002/0142171 A1 * | 10/2002 | Asayama et al. | 428/446 |
| 2002/0179003 A1 * | 12/2002 | Iida et al. | 117/19 |
| 2003/0015131 A1 * | 1/2003 | Iida et al. | 117/14 |
| 2003/0029375 A1 * | 2/2003 | Watanabe et al. | 117/13 |
| 2003/0106482 A1 * | 6/2003 | Kononchuk et al. | 117/13 |
| 2003/0116082 A1 * | 6/2003 | Sakurada et al. | 117/20 |
| 2003/0159647 A1 * | 8/2003 | Arvidson et al. | 117/30 |
| 2003/0175532 A1 * | 9/2003 | Asayama et al. | 428/446 |
| 2004/0083947 A1 * | 5/2004 | Weber et al. | 117/19 |
| 2004/0216659 A1 * | 11/2004 | Asayama et al. | 117/2 |
| 2004/0244674 A1 * | 12/2004 | Ono et al. | 117/19 |
| 2005/0087830 A1 | 4/2005 | Takeno et al. | |
| 2005/0098092 A1 * | 5/2005 | Wilson et al. | 117/84 |
| 2006/0016387 A1 * | 1/2006 | Yokoyama et al. | 117/84 |
| 2006/0075957 A1 * | 4/2006 | Takeno et al. | 117/84 |
| 2006/0156969 A1 * | 7/2006 | Hourai et al. | 117/89 |
| 2006/0266278 A1 * | 11/2006 | Ono et al. | 117/19 |
| 2007/0020893 A1 * | 1/2007 | Ueno et al. | 438/479 |
| 2007/0155134 A1 * | 7/2007 | Nakai et al. | 438/471 |
| 2007/0178668 A1 * | 8/2007 | Nakai et al. | 438/471 |
| 2007/0266930 A1 * | 11/2007 | Hoshi et al. | 117/20 |
| 2008/0107582 A1 * | 5/2008 | Hong et al. | 423/263 |
| 2008/0118424 A1 * | 5/2008 | Sadamitsu et al. | 423/324 |
| 2008/0213163 A1 * | 9/2008 | Mabuchi et al. | 423/464 |
| 2008/0286565 A1 * | 11/2008 | Koike et al. | 428/332 |
| 2008/0311342 A1 * | 12/2008 | Muller et al. | 428/134 |
| 2009/0022930 A1 * | 1/2009 | Falster et al. | 428/64.1 |
| 2009/0235861 A1 * | 9/2009 | Fujiwara et al. | 117/21 |

FOREIGN PATENT DOCUMENTS

| | | |
|---|---|---|
| JP | 2000-331933 | 11/2000 |
| JP | 2001-106594 | 4/2001 |
| JP | 2002-154891 | 5/2002 |
| JP | 2002-201091 | 7/2002 |
| JP | 2003-218120 | 7/2003 |

OTHER PUBLICATIONS

Ikari et al., Defect control in nitrogen doped Czyochralski Silicon Crystals, Solid State Phenomena vols. 69-70, 1999, pp. 161-166. Scitec Pubiications, Switzerland. XP002928046.

* cited by examiner

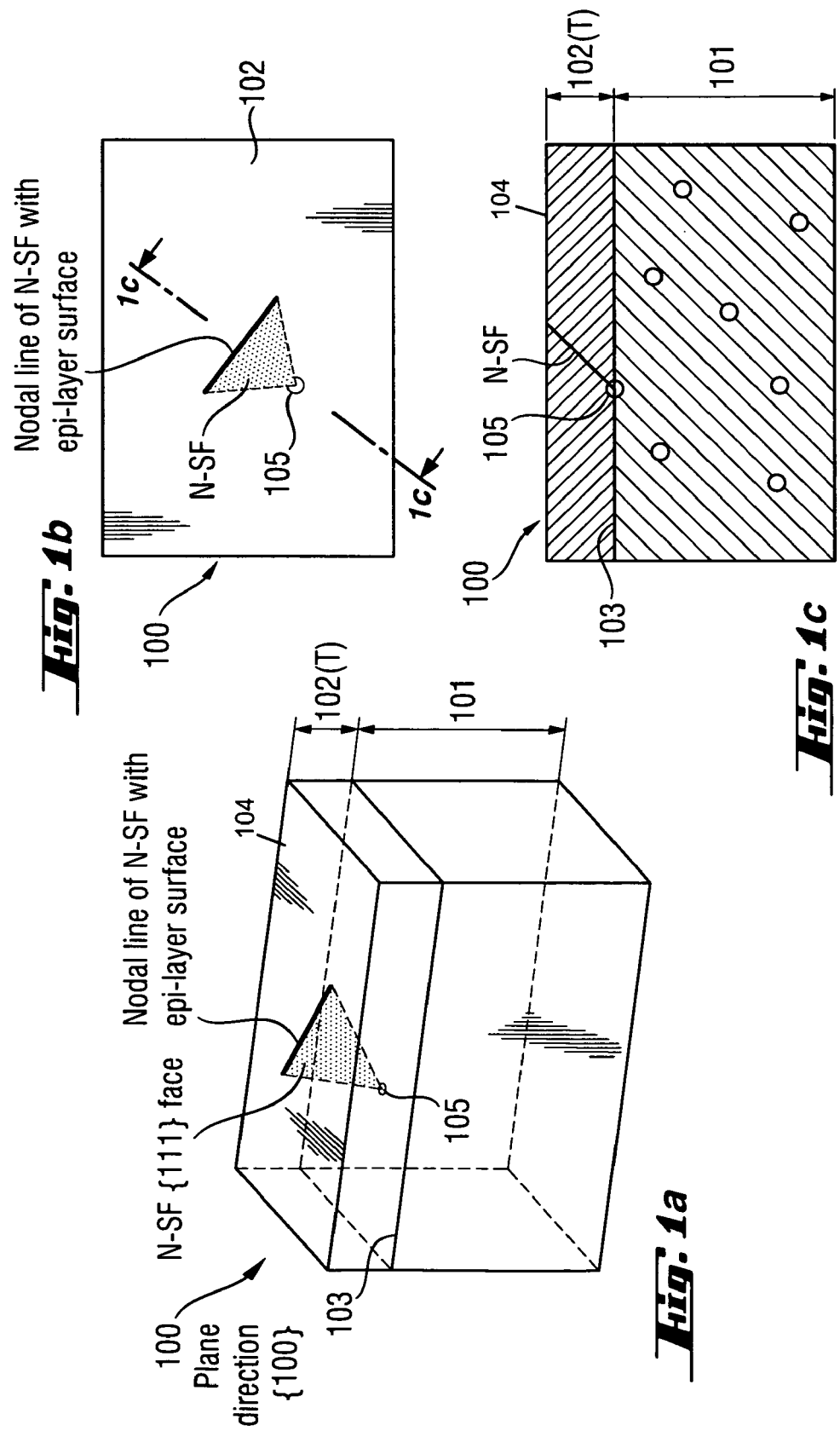

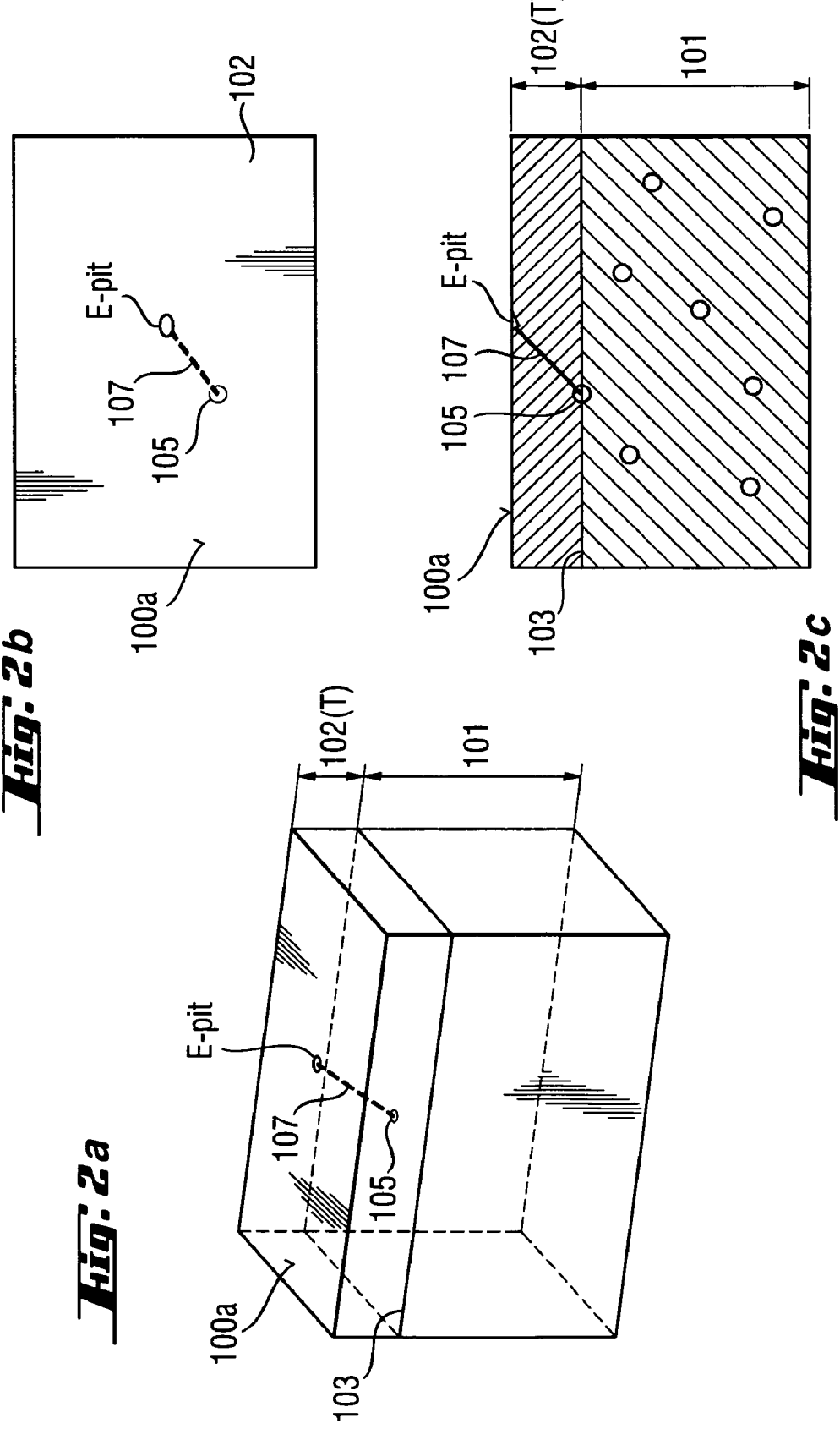

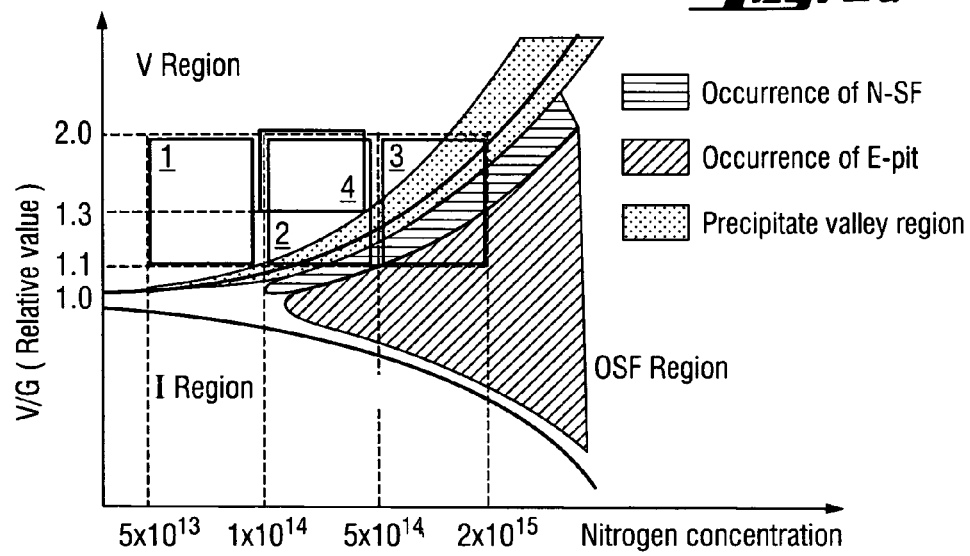

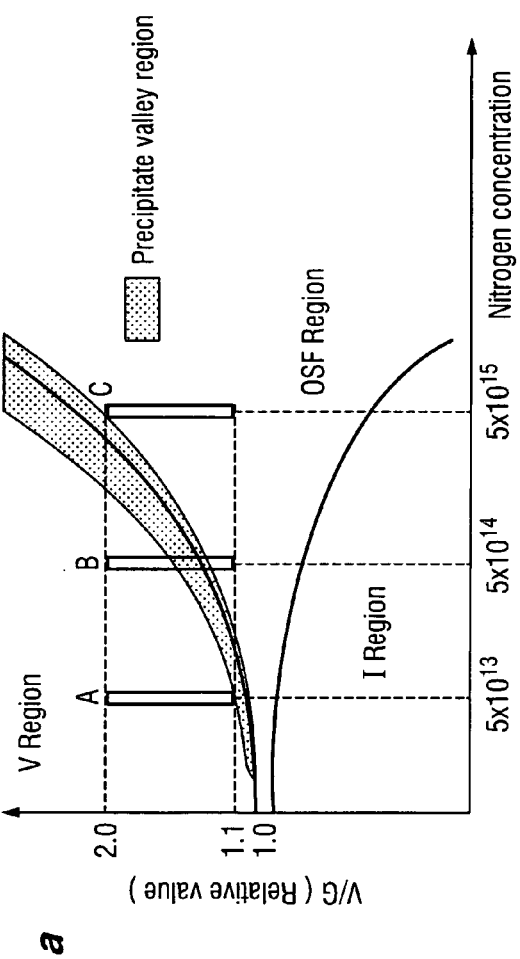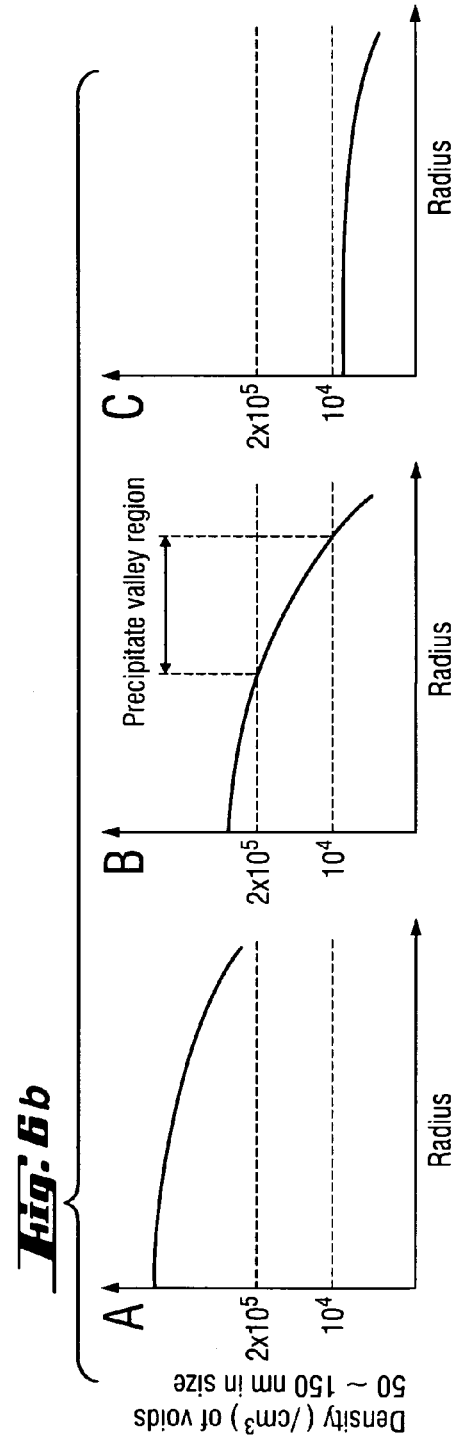
Fig. 6a
Fig. 6b

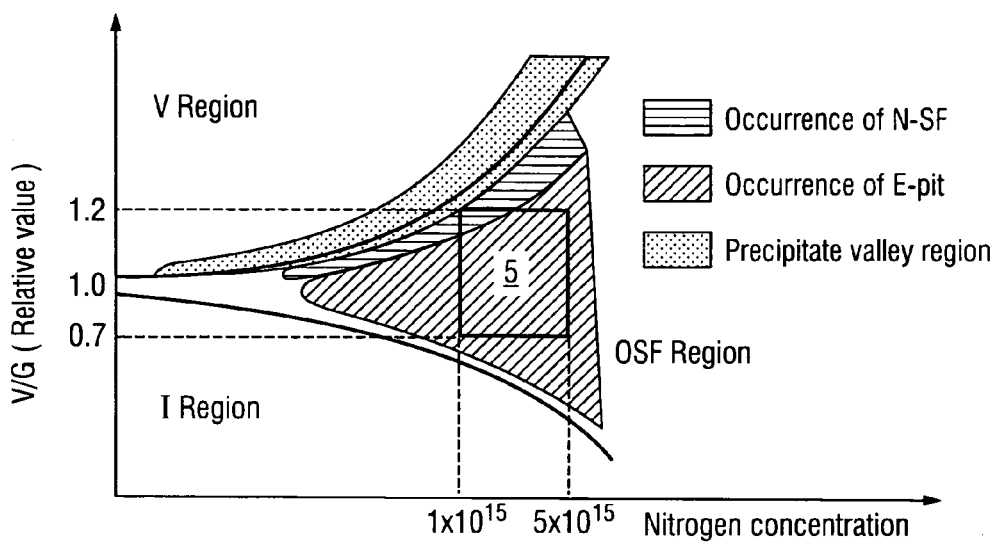

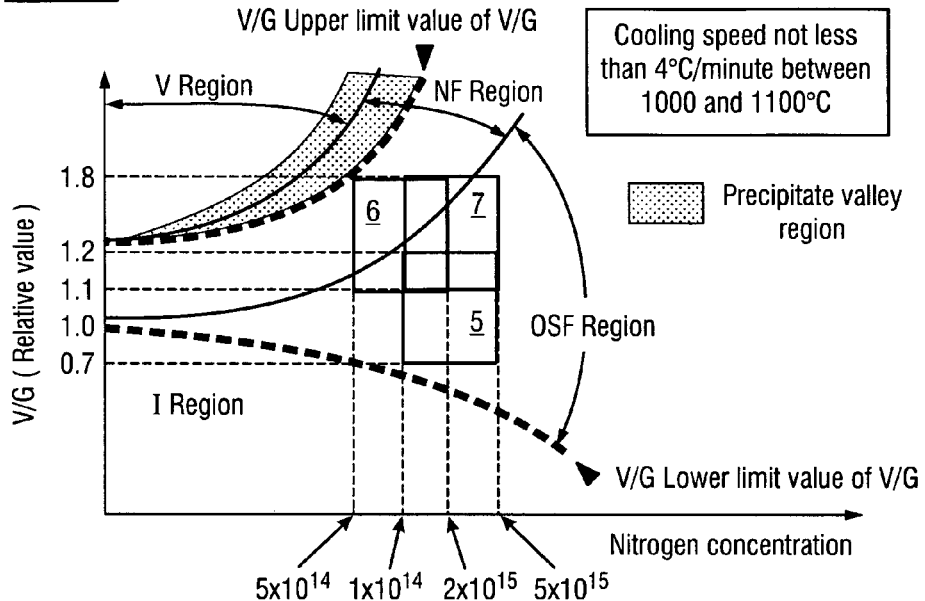

Fig. 8a

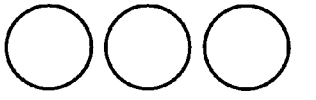

Fig. 8b

| | | Epi-Layer fault | Density of precipitate not less than $10^9$/cm$^3$ | In-plane dispersion of density of precipitate not more than 0.5 |
|---|---|---|---|---|
| Growth Condition Region 5 + not less than $1\times10^{16}$ of carbon + not less than 4°C/minute between 1000 and 1100°C | ○ ○ ○  Top side ← → Bottom side | ○ | ○ | ○ |
| Growth Condition Region 6 + not less than $1\times10^{16}$ of carbon + not less than 4°C/minute between 1000 and 1100°C | ○ ○ ○  Top side ← → Bottom side | ○ | ○ | ○ |
| Growth Condition Region 7 + not less than $1\times10^{16}$ of carbon + not less than 4°C/minute between 1000 and 1100°C | ○ ○ ○  Top side ← → Bottom side | ○ | ○ | ○ |

EPITAXIAL WAFER AND METHOD FOR PRODUCING EPITAXIAL WAFERS

RELATED APPLICATIONS

The present application claims the benefit of Japanese Patent Application, Serial No. 2006-005237, filed on Jan. 12, 2006, the complete disclosure of which is hereby incorporated by reference herein in its entirety and for all purposes. The present application is also a Continuation-in-Part of U.S. Utility patent application Ser. No. 11/645,017, filed on Dec. 22, 2006, titled ANNEALED WAFER AND MANUFACTURING METHOD OF ANNEALED WAFER, the complete disclosure of which is hereby incorporated by reference herein in its entirety and for all purposes.

FIELD OF THE DISCLOSURE

This disclosure relates to an epitaxial wafer and a method for the production of an epitaxial wafer.

BACKGROUND OF THE DISCLOSURE

A semiconductor substrate, particularly a silicon single crystal wafer (hereinafter referred to occasionally as a "substrate"), is used as the substrate for the manufacture of a highly integrated MOS device. Most silicon single crystal wafers are substrates that are cut from an ingot of silicon single crystal produced by the Czochralski (CZ) method.

The silicon single crystal wafer of this kind suffers supersaturated presence of oxygen that has been incorporated during the production of a single crystal. This oxygen is precipitated during the subsequent device processing and eventually causes an oxygen precipitate to form in the substrate. When this oxygen precipitate is present in a significant amount in the substrate, the heavy metals subsequently incorporated during the device process are believed to be absorbed in the substrate, and this leads to the effect that the surface of the substrate (i.e. a device active layer) is kept clean.

This effect can be used for intrinsic gettering (IG), which is used for the purpose of preventing deterioration of device properties by heavy metals contamination. The silicon single crystal substrate, therefore, is desired to induce oxygen precipitation moderately during the course of device processing.

For the purpose of securing the gettering ability, the silicon single crystal wafer requires presence of oxygen precipitate beyond a fixed density at the center of the thickness thereof. As a result of a test conducted to date, it has been ascertained that when the silicon single crystal wafer secures presence of oxygen precipitate at a density of not less than $1 \times 10^9$ precipitates/cm$^3$ midway between the surfaces of the wafer, it manifests a gettering ability against such heavy metals as Fe, Ni, and Cu even in a heat treatment performed in low-temperature device processing wherein the highest temperature is equal to or less than 1100° C.

Meanwhile, the silicon semiconductor substrate with a silicon single crystal layer (epi-layer) deposited (epi-deposited) on the surface of a silicon single crystal wafer (the so-called epitaxial wafer) has found acceptance as a substrate of still higher quality. Numerous epitaxial wafers have been used for manufacturing devices of higher density and higher integration.

In the present disclosure, the silicon single crystal wafer lacking an epi-deposition is called a mirror wafer and distinguished from a wafer with epi-deposition. The substrate on which the epi-deposition is effected is referred to herein as a "base plate."

The epitaxial wafer allows no presence of such grown-in defects as COP (crystal originated particle) on the surface of the base plate and is known to enhance such device property as a function of oxide film pressure resistance.

The epitaxial wafer is typically produced by a process of epitaxial deposition that consists in depositing a silicon single crystal layer at a high temperature of at least 1100° C. Thus, the epitaxial wafer subjected to this high-temperature treatment is less capable of inducing oxygen precipitation during device processing and becomes inferior in the gettering property to the aforementioned mirror wafer that lacks epi-deposition. The cause of this disadvantage is believed to be that the oxygen precipitation nuclei are diminished or eliminated during the high-temperature heat treatment of the epi-deposition process and therefore oxygen precipitation does not occur in the subsequent device processing.

As one way of compensating for the shortage of oxygen precipitation in the epitaxial wafer, a method that comprises subjecting the substrate, prior to undergoing epi-deposition, to a heat treatment and subsequently carrying out the epi-deposition has been proposed. Since this method entails addition to the number of steps of process, it may lead to the disadvantage of increasing the cost of production of the epitaxial wafer.

By contrast, methods have been proposed for producing an epitaxial wafer that induces oxygen precipitation during device processing without requiring a heat treatment in advance of epi-deposition. One method to produce an epitaxial wafer uses a carbon-added base plate as a substrate (refer to Patent Document 1). Other methods for producing an epitaxial wafer use a nitrogen-added base plate as a substrate (refer to Patent Document 2 and Patent Document 3) Another method for producing an epitaxial wafer uses as a substrate a base plate having both carbon and nitrogen added (refer to Patent Document 4).

In the case of the epitaxial wafer resulting from subjecting a carbon-doped substrate to epi-deposition, oxygen precipitation does not occur at temperatures above 800° C., though it does occur in a temperature range falling short of 800° C. Device processing rarely involves a heat treatment below 800° C., and therefore, possibly reveals deficiency in the IG ability because of the failure to induce oxygen precipitation sufficiently.

By contrast, in the case of the epitaxial wafer resulting from subjecting a nitrogen-doped substrate to epi-deposition, the oxygen precipitation occurs even in a temperature range exceeding 800° C. and, what is more, the density of the oxygen precipitate is always constant irrespective of the conditions of heat treatment. Thus, it is made possible to produce an epitaxial wafer that is capable of manifesting the IG ability in any device process.

This advantage may be due to the fact that the addition of nitrogen results in forming thermally stable nuclei of oxygen precipitation during the growth of crystal. These nuclei are not diminished during the process of epi-deposition and, as a result, oxygen precipitate occurs based on these nuclei of oxygen precipitation during the device heat treatment subsequent to the epi-deposition. Since the thermal hysteresis during crystal growth serves as some kind of pretreatment for epi-deposition, it may be inferred that the base plate immediately subsequent to the growth of crystal is already in a state capable of inducing oxygen precipitation even after the epi-deposition. Using this base plate as the substrate secures the oxygen precipitation subsequent to the epi-deposition without the heat treatment prior to the epi-deposition. What is more, since the density of oxygen precipitation in the epitaxial wafer produced from the nitrogen-added base plate is constant irrespective of heat treatment, it is possible to produce an epitaxial wafer with IG ability for any device processing. Thus nitrogen is believed to be superior as a dopant for this purpose as compared to other elements such as, for example, carbon.

Thus, the nitrogen-doped base plate serves to secure stable oxygen precipitation without requiring an extra heat treatment. It has been found, however, that when the nitrogen-doped base plate is subjected to epi-deposition, the resultant epi-layer suffers occurrence of such crystal defects as N-SF and E-pit.

FIGS. 1a, b, and c are explanatory drawings illustrating the N-SF defect among other crystal defects. An epitaxial wafer 100 illustrated in the drawing is a product of deposition of an epi-layer 102 on a substrate 101 adapted for epi-deposition. Incidentally, FIG. 1a is a schematic perspective view of the inner structure of the epitaxial wafer 100, FIG. 1b is a plan view of the N-SF part as observed from above, and FIG. 1c is a cross section of the N-SF part.

The N-SF is an interstitial atom-type stacking fault on the {111} face extending from an interface 103 between the substrate 101 and the epi-layer 102 to the surface 104 of the epi-layer 102. Particularly when the stacking fault in the substrate 101 appears on the interface 103, the N-SF tends to occur with that fault 105 as the starting point.

The N-SF, when the substrate 101 is subjected to epi-deposition, is shaped as an equilateral triangle having a side length of about $T \times \sqrt{2}$ [μm], wherein T [μm] denotes the thickness of epi-layer. Since the N-SF of this structure, when visually examined with a surface analyzer, appears as the same scattered image as a foreign matter on the base plate, the number of occurrences of the N-SF can be evaluated by subjecting the base plate, subsequent to the epi-deposition, to measurement with the surface analyzer.

FIGS. 2a, b, and c are explanatory drawings illustrating the E-pit defect among other crystal defects. An epitaxial wafer 100a illustrated in the drawing is a product of selectively etching an epitaxial wafer having generated E-pit. Incidentally, FIG. 2a is a schematic perspective view, FIG. 2b is a plan view of the E-pit part as observed from above, and FIG. 2c is a cross section of the E-pit part.

The E-pit consists of one or more dislocations 107 extending from the defect 105 present in the interface 103 between the substrate 101 and the epi-layer 102 to the surface of the epi-layer 102. Though the E-pit escapes detection with a surface analyzer, the number of E-pits can be evaluated by counting the pits which are formed by subjecting the surface of the base plate subsequent to the epi-layer deposition to such selective etching as light etching and Secco etching. The epitaxial wafer surface subsequent to selective etching is denoted as 100a. Incidentally, the etching amount [μm] by the selective etching should be equal to or smaller than the film thickness T [μm] of the epi-layer.

The N-SF and the E-pit are presumed to be defects that are formed in the epi-layer 102 from crystal defects that were present from the beginning in the substrate 101 as the starting points.

If the N-SF is present in an amount exceeding 0.05 occurrences/cm$^2$ or the E-pit is present in an amount exceeding 0.05 occurrences/cm$^2$, the probability that the defect will induce a failure in a device having an electrode surface area of 20 mm$^2$, for example, will exceed 5%. Since an electrode including such occurrences of defects suffers deterioration of such electric properties as TDDB, a base plate in which such occurrences of defects are present cannot be used as a silicon semiconductor base plate for a high-quality device. It is, therefore, desired that the amounts of N-SF or E-pit be kept below 0.05 occurrences/cm$^2$.

These peculiar crystal defects as N-SF and E-pit that are generated in the epi-layer 102 in consequence of the addition of nitrogen have a close relation with the defect region present in the nitrogen-added base plate prior to the epi-deposition. For the purpose of preventing the epi-layer defect, therefore, it is desired to control the defect region present in the base plate prior to the epi-deposition.

FIG. 3 is an explanatory drawing illustrating the relation of the defect region and the nitrogen concentration in the silicon single crystal that has been pulled by the Czochralski (CZ) method. FIG. 3a is a graph showing the relation between the defect region present in a base plate used for a substrate prior to epi-deposition and the nitrogen concentration and FIG. 3b is a schematic drawing showing the defect region in a silicon single crystal ingot 200 in the course of being pulled and the nitrogen concentration distribution.

The CZ method, as is generally known, consists in pulling a silicon single crystal ingot 200 from a silicon melt 201 upward and meanwhile causing it to grow. In a base plate cut out of this silicon single crystal ingot 200, three kinds of defect regions (V region, OSF region, and I region) are present as shown in FIG. 3a.

First, the V region is a region into which excess vacancies are introduced from the solid-liquid interface during the growth of crystal. It suffers the presence of voids resulting from aggregation of such atomic vacancies.

The OSF region is a region into which excess vacancies are introduced from the solid-liquid interface during the growth of crystal. This region is where OSF occurs when the silicon single crystal wafer is subjected to an oxidizing heat treatment. The term "OSF" as used herein refers to a disk-like stacking fault measuring about several μm in diameter and including oxygen precipitates (OSF nuclei) at the center. It is formed in consequence of the phenomenon that the interstitial atoms generated by the oxidizing heat treatment from oxide film/silicon interface aggregate on the periphery of the OSF nucleus. The term "OSF nucleus" refers to a special oxygen precipitate possessing the nature of gathering interstitial atoms among other oxygen precipitates. It is presumed to be already present in the base plate at the stage immediately after the growth of crystal. Since the OSF nucleus has a small size (presumed to be not more than 10 nm), it cannot be detected by the existing method of evaluation using a contamination meter or an infrared tomography. The presence of OSF, therefore, is not ascertained unless the sample is subjected to the oxidizing heat treatment.

The I region is a region into which excess interstitial atoms are introduced from the solid-liquid interface during crystal growth. It includes a dislocation loop resulting from the aggregation of interstitial atoms.

From prior information, it has been known that the occurrence of the defect region in a base plate depends on the nitrogen concentration and the condition of V/G crystal growth, wherein V denotes the pulling speed [mm/min] and G denotes the average temperature gradient [° C./mm] from the melting point to 1350° C. in the direction of the axis of crystal growth (refer to non-Patent Document 1 and Non-Patent Document 2, which are hereby incorporated herein for all purposes).

In the case of a base plate cut from a silicon single crystal ingot with no nitrogen dopant, an increase of V/G beyond a specific value results in causing excess vacancies to occur and form a V region or an OSF region in the base plate. Then, a decrease of V/G below a specific value results in causing excess interstitial atoms to occur and form an I region in the base plate. Nitrogen meanwhile has an effect on the amounts of vacancies and interstitial atoms that occur via the solid-liquid interface. Thus, the defect region of a base plate cut from a nitrogen-doped silicon single crystal ingot can be expressed by a two-dimensional defect region map having nitrogen concentration and V/G as two axes as shown in FIG. 3a.

Then, a single pull of single crystal out of the nitrogen-doped silicon, as shown in FIG. 3a, has a certain spread of nitrogen concentration and V/G values forming a rectangular region (called growth condition region) in the nitrogen concentration-V/G diagram. This is because the nitrogen-doped silicon single crystal ingot 200 gains in nitrogen concentration toward the lower side and the outer peripheral part of crystal has a low V/G as compared with the central part as shown in FIG. 3b.

The addition of nitrogen to the CZ-silicon single crystal is implemented by using a nitrogen-doped melt. It is believed that the ratio (segregation coefficient) of nitrogen drawn into the crystal from the melt while the melt is solidifying is extremely small. As a result, the greater part of the nitrogen in the melt remains behind in the melt and the nitrogen concentration in the melt accordingly increases as the growth of crystal proceeds. In the lower part of the crystal, nitrogen concentration is consequently heightened. Although the average temperature gradient G [° C./mm] from the melting point to 1350° C. in the direction of the axis of crystal growth depends on the cooling capacity for the crystal, the value of G is larger in the outer peripheral part of crystal because the outer peripheral part of crystal is generally cooled easily. As a result, the value of V/G is lower in the outer peripheral part of crystal.

The defect region of the nitrogen-doped silicon single crystal of this nature can be described by having the range of growth condition of one silicon single crystal ingot overlap the two-dimensional defect region map using nitrogen concentration and V/G as two axes. In the crystal having the growth condition region as illustrated in FIG. 3, for example, the V region tends to occur in the central portion of crystal and the OSF region in the outer peripheral part of crystal. The void region tends to expand throughout the entire surface of the base plate when the range of nitrogen concentration is fixed and the value of V/G is increased. The void region contracts toward the center of the base plate and the I region tends to expand throughout the entire surface of the base plate when the value of V/G is decreased. When the value of V/G is fixed and the nitrogen concentration is heightened, the OSF region is generated from the outer peripheral part and tends to expand throughout the entire surface of the base plate.

As a result of a detailed study pursued concerning the relation between the epi-layer defect generated in the epitaxial wafer using a nitrogen-doped base plate (substrate), including the fault regions mentioned above and the nitrogen concentration and the V/G rate, it has been found that the defect regions subsequent to the epi-deposition assume such an appearance as shown in FIGS. 4a and b. Here, FIG. 4a is a graph showing the relation of the nitrogen concentration and the V/G rate and FIG. 4b shows the status of occurrence of N-SF and E-pit in the in-plane part of a base plate for several different growth condition regions. In FIGS. 4a and b, the growth condition region 1 has nitrogen concentration of $5 \times 10^{13}$ to $1 \times 10^{14}$ atoms/cm$^3$ and V/G (relative value) of 1.1 to 2.0, the growth condition region 2 has nitrogen concentration of $1 \times 10^{14}$ to $5 \times 10^{14}$ atoms/cm$^3$ and V/G (relative value) of 1.1 to 2.0, the growth condition region 3 has nitrogen concentration of $5 \times 10^{14}$ to $2 \times 10^{15}$ atoms/cm$^3$ and V/G (relative value) of 1.1 to 2.0, and the growth condition region 4 has nitrogen concentration of $1 \times 10^{14}$ to $5 \times 10^{14}$ atoms/cm$^3$ and V/G (relative value) of 1.3 to 2.0.

The normalized values of V/G shown herein are based on a unity value (1.0) that is the value of V/G at the position at which an OS occurs in a base plate when a crystal with no nitrogen dopant is pulled.

The N-SF and the E-pit, which are epi-layer defects, appear at a position corresponding to the OSF region in a substrate prior to the epi-deposition.

In the growth condition region 1, no epi defect occurs. In the growth condition region 2, N-SF occurs on the outer peripheral side only on the bottom side of a crystal. In the growth condition region 3, N-SF or E-pit occurs on the outer peripheral side from the top side through the bottom side of a crystal.

For the purpose of producing a nitrogen-doped base plate that tends toward no occurrence of crystal fault, like N-SF or E-pit, in an epi-layer 102, it is desirable to control crystal growth so as to exclude the OSF region of a base plate from the outer peripheral part of crystal. As a way of realizing a nitrogen-doped base plate excluding the OSF region mentioned above, a method of lowering the nitrogen concentration or a method of heightening the minimum value of V/G (namely the V/G on the crystal edge side) as shown in the growth condition region 4 may be desirable.

When the nitrogen concentration is lowered as in the growth condition region 1, however, since the density of oxygen precipitation is degraded, the ability of gettering is deteriorated inevitably in spite of prevention of the epi-layer defect.

In Patent Document 2 and Patent Document 3, a method for eliminating an OSF region from a base plate and avoiding an epi-layer defect by controlling crystal growth conditions is disclosed (corresponding to growth condition region 4).

Since the ranges of the optimum nitrogen concentration and pulling conditions necessary for the prevention of epi-layer fault are extremely narrow, and particularly the V/G is greatly varied according to the construction of a pulling oven or furnace and the conditions of the silicon melt, assuring repeatable quality is difficult. Further, this method cannot be applied to a crystal of such a large diameter as 300 mm, for example. This is because in a crystal having a large diameter, the cooling capacity for the crystal deteriorates and the V/G cannot be sufficiently increased.

While increasing the density of the oxygen precipitate subsequent to the epi-deposition calls for an increased nitrogen concentration, the prevention of the epi-layer defect becomes practically impossible when the nitrogen concentration exceeds a certain upper limit. As a result, various users' specifications for the densities of oxygen precipitate cannot be adequately handled because the controllable density of oxygen precipitate ultimately reaches an upper limit.

As a way of avoiding this problem, a method that consists in doping carbon in addition to nitrogen as disclosed in Patent Document 4 is believed to be effective. This is because the crystal defect (presumed to constitute a cause for N-SF and E-pit) formed in the base plate in consequence of the doping of nitrogen is rendered harmless by the simultaneous doping of carbon. The method for avoiding the epi-layer defect by doping carbon in addition to nitrogen as described above (by adding carbon in a ratio of not less than $1 \times 10^{16}$ atoms/cm$^3$ to the growth condition region 2 or 3) is capable of preventing the epi-layer defect. This is accomplished without resorting to a measure to increase the lower limit of the V/G value by controlling the crystal growth condition and consequently enabling stable supply of such a large-diameter crystal as avoids forming an epi-layer defect.

In recent years, the trend of increasing the diameter of an epitaxial wafer from 200 mm to 300 mm has given rise to new demands concerning the property of oxygen precipitation.

(1) A demand for uniformly controlling the density of oxygen precipitate subsequent to a heat treatment in the radial direction in the base plate. The reason for this demand is that when the density of oxygen precipitate decreases in the radial direction in the base plate, the base plate suffers deficiency in the gettering ability in the areas of decreased density, which induces a decline in process yield. It has been found that in the case of an epitaxial wafer using a nitrogen-doped crystal, the radial direction distribution of oxygen precipitate closely corresponds to the defect region of the base plate. This fact means that the control of the defect region in the radial direction of the crystal becomes difficult. Also, the radial direction distribution of the density of oxygen precipitate becomes non-uniform because the cooling speed during the growth of crystal differs outside and inside the crystal when the crystal diameter becomes as large as 300 mm.

(2) A demand for increased density of oxygen precipitate. The reason for this demand is that a highly integrated MOS device produced from a large-diameter epitaxial wafer (e.g., measuring 300 mm in diameter) tends to lower the temperature of the heat treatment in device processing (the highest temperature not higher than 1100° C.) as compared with a highly integrated MOS device produced from an epitaxial wafer measuring not more than 200 mm in diameter. This fact means that the heavy metals incorporated in the course of device processing are less likely to be sufficiently diffused and to be absorbed by the oxygen precipitate in the radial direction in the base plate. For the purpose of securing the gettering ability sufficiently subsequent to such a low-temperature and short-duration heat treatment as mentioned above, it is desired that the density of the oxygen precipitate be further increased. As a result of a detailed study, it has been ascertained empirically that when the density of oxygen precipitate in an epitaxial wafer is measured along the radius of the wafer, the decline in the process yield in the radial direction in the base plate due to insufficient gettering becomes conspicuous as the radial distribution variation of the density of oxygen precipitate expressed by the following formula exceeds 0.5. Specifically, the radial distribution variation is found in accordance with the following formula.

Radial distribution variation of the density of oxygen precipitate=(Maximum density of oxygen precipitate−minimum density of oxygen precipitate)/Maximum density of oxygen precipitate When an epitaxial wafer using a nitrogen-doped base plate or a nitrogen- and carbon-doped base plate as a substrate was subjected to a detail study concerning the radial direction distribution of oxygen precipitate subsequent to a heat treatment, it was found that a portion in which the density of oxygen precipitate dropped as compared with the environment thereof was present in the wafer. In the case of the growth condition region 2 or 3 shown in FIG. 4, the radial distribution variation of the density of oxygen precipitate eventually exceeded 0.5 because of the presence of the portion in which the degree of oxygen precipitate dropped as compared with the environment thereof in addition to the formation of N-SF or E-pit.

The method that employs simultaneous doping of nitrogen plus carbon as disclosed in Patent Document 4 is effective in reducing epi-layer faults. Regarding the dispersion of the radial direction distribution of oxygen precipitate, however, the simultaneous doping of carbon has no effect. To be specific, when carbon is doped in a ratio of not less than $1 \times 10^{16}$ atoms/cm$^3$ to a crystal in the growth condition region 2 or 3 shown in FIG. 4, the radial distribution variation of the density of oxygen precipitate inevitably exceeds 0.5 because of the presence of a portion in which the density of oxygen precipitate dropped as compared with the environment thereof in spite of the success achieved in preventing the epi-layer defect.

Methods for producing an epitaxial wafer enabled to achieve radial direction uniformity of the density of oxygen precipitate have been known (refer, for example, to Patent Document 6). The technical points of these methods consist in limiting the OSF region at the outside of crystal or contracting it toward the interior of crystal. An effort to limit the OSF region at the outside of crystal corresponds to the growth condition region 1 shown in FIG. 4 and is incapable of gaining in the density of oxygen precipitate sufficiently as already described. An effort to contract the OSF region toward the interior of crystal corresponds to using the I region shown in FIG. 4. The I region causes the density of oxygen precipitate to decrease and the dislocation loop present in the I region gets transferred to an epi-layer and eventually causes an epi-layer defect to form.

Owing to the foregoing state of affairs, it has been difficult to manufacture by the existing technique such an epitaxial wafer as exhibits a high density of oxygen precipitate and allows the density to be uniformly distributed in the radial direction part of a base plate without entailing formation of an epi-layer defect.

[Patent Document 1] JP-A H10-50715
[Patent Document 2] JP-A 2001-106594
[Patent Document 3] JP-A 2002-154891
[Patent Document 4] JP-A 2002-201091
[Patent Document 5] JP-A 2000-331933
[Patent Document 6] JP-A 2003-218120
[Non-Patent Document 1] V. V. Voronkov, K. Crystal Growth, 59 (1982) 625
[Non-Patent Document 2] M. Iida, W. Kusai, M. Tamatsuka, E. Iino, M. Kimura, and S. Muraoka, Defect in Silicon, ed. T. Abe, W. M. Bullisetal (ECS., Pennington N.J., 1999) 499

DISCLOSURE

Issues Addressed by the Disclosure

It has been already described that the radial direction distribution of oxygen precipitate is closely related to the defect region in a base plate determined by the nitrogen concentration and the crystal growth condition V/G. For the purpose of rendering uniform the radial direction distribution of oxygen precipitate, therefore, it is desired that the crystal growth conditions such as V/G be optimally controlled during the growth of the crystal that is doped with nitrogen and carbon.

This disclosure is aimed at providing a method for the production of an epitaxial wafer wherein sufficient oxygen precipitation occurs subsequent to epi-deposition and not suffering presence of an epi-layer defect caused by nitrogen, and an epitaxial wafer manufactured by this method of production.

[Manners of Addressing the Issues]

The factors mentioned above are accomplished by the following:

(1) An epitaxial wafer having a single crystal layer formed by epitaxial growth on a silicon single crystal substrate, the epitaxial wafer characterized by the fact that the epitaxial wafer in consequence of a heat treatment at 1000° C. for 16 hours generates radial direction oxygen precipitate at the minimum density of not less than $1 \times 10^9$ pieces/cm$^3$ and the radial distribution variation of oxygen precipitate density of not more than 0.5 and forms as epi-layer defects on the whole surface of the epitaxial wafer not more than 0.05 occurrences of N-SF/cm$^2$ and not more than 0.05 occurrences of E-pit/cm$^2$.

(2) A method for the production of an epitaxial wafer set forth in the foregoing item (1), characterized by causing silicon single crystal in the process of being produced by the Czochralski method to grow under the conditions having the V/G value [mm$^2$/° C. min] between the upper limit of $1.4\exp(6.2 \times 10^{-16} \times$ nitrogen concentration [atoms/cm$^3$])$\times$(V/G) crit and the lower limit of $1.0\exp(-7.1 \times 10^{16} \times$ nitrogen concentration [atoms/cm$^3$])$\times$(V/G) crit (wherein V denotes pulling speed [mm/min]; G denotes average temperature gradient [° C./mm] from the melting point to 1350° C. in the direction of crystal growth axis; and (V/G) crit denotes the V/G value for silicon single crystal without nitrogen dopant that is contiguous to the boundary of one region, the one region denoting a region into which excess interstitial atoms are introduced from the solid-liquid interface during the growth of crystal) and having the cooling speed of not lower than 4° C./minute between 1100 and 1000° C., subjecting the grown silicon single crystal to simultaneous doping of nitrogen and carbon at a nitrogen concentration of $5 \times 10^{14}$ to $5 \times 10^{15}$ atoms/cm$^3$ and a carbon concentration of $1 \times 10^{16}$ to $1 \times 10^{18}$ atoms/cm$^3$ and using a base plate cut from the silicon single crystal resulting from the addition as a substrate, and depositing on the surface of the substrate a silicon single crystal layer by the epitaxial method.

(3) The I region mentioned above is characterized by being a region having a dislocation pit density of not less than 10 occurrences/cm$^2$.

Here, the range of the nitrogen concentration and V/G is set between the upper limit [mm$^2$/° C. min] of $1.4\exp(6.2 \times 10^{-16} \times$ nitrogen concentration [atoms/cm$^3$])$\times$(V/G) crit and the lower limit [mm$^2$/° C. min] of $1.0\exp(-7.1 \times 10^{-16} \times$ nitrogen concentration [atoms/cm$^3$])$\times$(V/G) crit (wherein (V/G) crit denotes the V/G value for silicon single crystal without nitrogen dopant that is contiguous to the boundary of V region and I region) for the purpose of conferring radial direction uniformity on the density of oxygen precipitate generated subsequent to a heat treatment and keeping the radial distribution variation of the density of oxygen precipitate below 0.5. If the value of V/G ultimately exceeds the upper limit mentioned above, the interior of a base plate will suffer occurrence of a region in which the density of voids measuring 50 to 150 nm in size falls in the range of $10^4$ to $2 \times 10^5$/cm$^3$ and consequently the density of radial-direction dispersion of the density of oxygen precipitate will likely exceed 0.5. If the value of V/G falls short of the lower limit mentioned above, the interior of the base plate will suffer occurrence of the I region and consequently the degree of radial direction dispersion of the density of oxygen precipitate will likely exceed 0.5.

The concentration of carbon plus nitrogen is set at a level of not less than $1 \times 10^{16}$ atoms/cm$^3$ and, as a crystal growth condition, the cooling speed between 1100 and 1000° C. is set at a level of not lower than 4° C./minute for the purpose of enabling the range of the nitrogen concentration and the range of V/G to be set so that the entire surface of the base plate will become an OSF region when the nitrogen-doped crystal with no carbon is pulled and limiting N-SF to less than 0.05 occurrences/cm$^2$ and limiting E-pit to less than 0.05 occurrences/cm$^2$. If the carbon concentration falls short of $1 \times 10^{16}$ atoms/cm$^3$ or the cooling speed between 1100 and 1000° C. as a crystal growth condition falls short of 4° C./min, the N-SF will exceed 0.05 occurrences/cm$^2$ or the E-pit will exceed 0.05 occurrences/cm$^2$. If the carbon concentration exceeds $1 \times 10^{18}$ atoms/cm$^3$, the single crystal growth will become difficult because this tends to cause formation of a polycrystal. Thus, the carbon concentration is preferably not more than $1 \times 10^{18}$ atoms/cm$^3$.

The effort to ensure absence of a region in which the density of voids measuring not less than 50 nm and not more than 150 nm falls in the range of $10^4$ to $2 \times 10^5$/cm$^3$ is desired for the purpose of enabling the density of oxygen precipitate formed subsequent to a heat treatment to be uniform in the radial direction in a silicon semiconductor base plate and consequently limiting the radial distribution variation of the density of oxygen precipitate below 0.5. If the silicon semiconductor base plate includes a region having a density of voids measuring 50 to 150 nm in the range of $10^4$ to $2 \times 10^5$/cm$^3$, the density of oxygen precipitate will become lower in the relevant region than in the environment thereof and consequently the radial distribution variation of the density of oxygen precipitate will likely exceed 0.5.

The effort to keep the concentration of nitrogen above $5 \times 10^{14}$ atoms/cm$^3$ is desired for the purpose of securing the density of oxygen precipitate above $1 \times 10^9$ precipitates/cm$^3$, a magnitude sufficient for gettering.

If the concentration of nitrogen falls short of $5 \times 10^{14}$ atoms/cm$^3$, the density of oxygen precipitate of an epitaxial wafer will fall short of $1 \times 10^9$ precipitates/cm$^3$ and consequently the gettering ability sufficient for heavy metals will not be obtained. If the concentration of nitrogen exceeds $5 \times 10^{15}$ atoms/cm$^3$, the density of oxygen precipitate will increase excessively and consequently device processing will suffer increased slip dislocation. Thus, the density of nitrogen is preferably not more than $5 \times 10^{15}$ atoms/cm$^3$.

[Results]

The method of production contemplated by this disclosure enables a silicon semiconductor base plate of high quality to be reliably produced without entailing an appreciable increase of cost because it allows the conventional device for the production of silicon single crystal using the CZ method to be utilized in its unmodified form and does not need to go through a complicated process of production.

Then, this method is capable of providing an epitaxial wafer that neither forms an epi-layer defect nor reveals non-uniform oxygen precipitation but excels in device properties. This epitaxial wafer is a preferred base plate for the manufacture of a MOS device that is required to possess a high degree of integration and exhibit high reliability.

BRIEF DESCRIPTION OF THE DRAWINGS

FIG. 1 This is an explanatory drawing illustrating N-SF among crystal faults; (a) is a schematic perspective view showing the inner structure, (b) is a plan view showing the N-SF part as observed from above, and (c) is a cross section of the N-SF part.

FIG. 2 This is an explanatory drawing illustrating E-pit among crystal faults; (a) is a schematic perspective view, (b) is a plan view of the E-pit part as observed from above, and (c) is a cross section of the E-pit part.

FIG. 5 (a) is a graph showing the relation between the nitrogen concentration and the V/G and (b) is a diagram showing the distribution of faults in the radial direction in the base plate, the presence of an epi-layer defect, whether the density of oxygen precipitate is not less than $10^9/cm^3$ or not, and whether the in-plane dispersion of the density of oxygen precipitate is not more than 0.5 or not.

FIG. 6 This is a graph illustrating the radial direction distribution of voids and the radial direction distribution oxygen precipitate; (a) is a graph showing the relation between the nitrogen concentration and the V/G and (b) is a graph showing the results of the measurement of the densities of voids 50 to 150 nm in size in the regions of A, B, and C in the direction of the radius of the base plate.

FIG. 7 This is an explanatory drawing illustrating the relation between the fault regions of crystal, with nitrogen and carbon simultaneously added, and produced under the condition of low V/G, the epi-layer defect, and the radial direction distribution of oxygen precipitate; (a) is a graph showing the relation between the nitrogen concentration and the V/G and (b) is a diagram showing the distribution of faults in the radial direction in the base plate, the presence of an epi-layer fault, whether or not the density of oxygen precipitate is less than $10^9/cm^3$, and whether or not the radial direction dispersion of the density of oxygen precipitate is more than 0.5.

FIG. 8 This is an explanatory drawing illustrating the conditions for producing an epitaxial wafer having oxygen precipitate uniformity; (a) is a graph showing the relation between the nitrogen concentration and the V/G and (b) is a diagram showing the distribution of faults in the radial direction in the base plate, the presence of an epi-layer fault, whether or not the density of oxygen precipitate is less than $10^9/cm^3$, and whether or not the radial direction dispersion of the density of oxygen precipitate is more than 0.5.

EXPLANATION OF REFERENCE NUMERALS

Figure 3A:
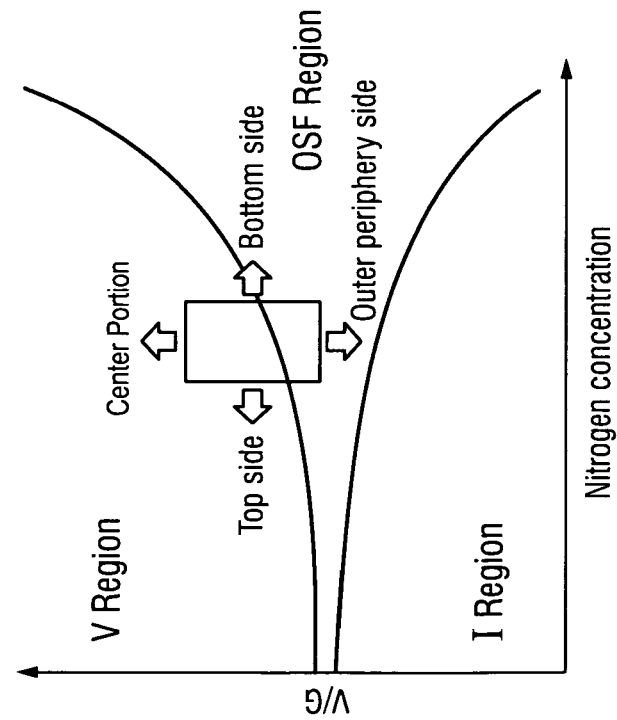
FIG. 3 This is an explanatory drawing illustrating the relation between the fault region and the nitrogen concentration in silicon single crystal pulled by the CZ method; (a) is a graph showing the relation between the fault region existing in the base plate prior to the epi-deposition and the nitrogen concentration and (b) is a schematic drawing showing the fault region and the distribution of nitrogen concentration in the silicon single crystal in the process of being pulled.
Figure 3B:
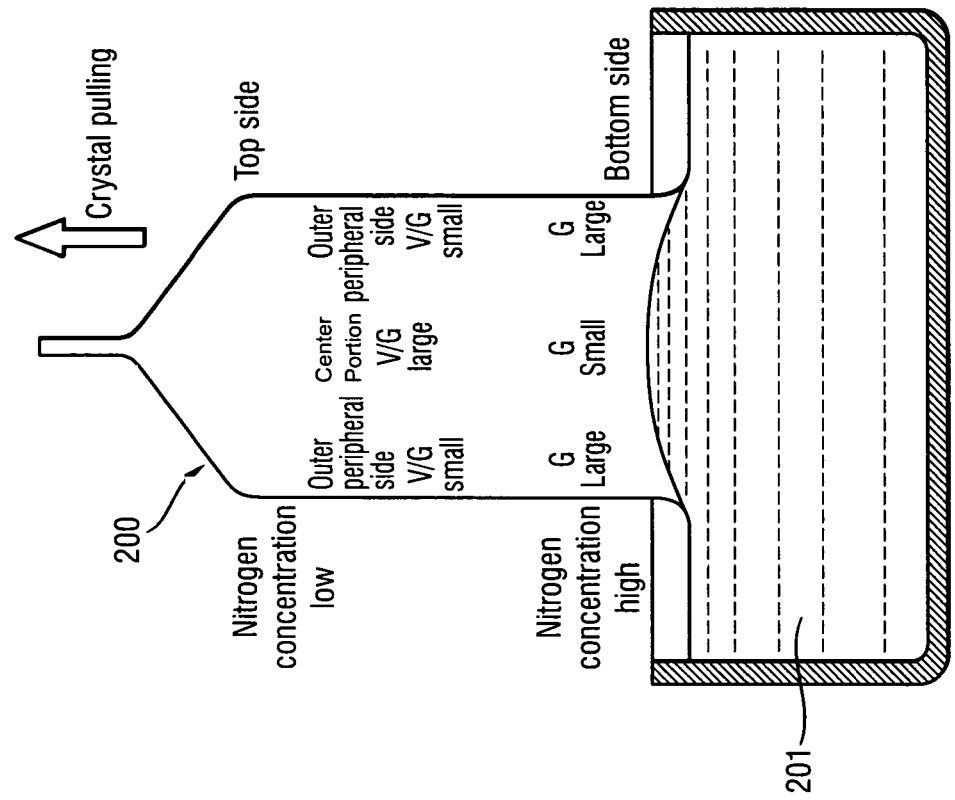

100 Epitaxial wafer
100a Epi-layer surface subsequent to selective etching
101 Substrate
102 Epi-layer
103 Phase boundary
104 Epi-layer surface
105 Fault
107 Dislocation
200 Silicon single crystal ingot
201 Silicon melt

BEST MODE

Now, the best mode of this disclosure will be explained below.

First, a method for producing a crystal intended to reconcile prevention of epi-layer defect and radial direction uniformity of oxygen precipitate.

The density of oxygen precipitate in an epitaxial wafer using a nitrogen-doped substrate depends on the concentration of nitrogen in such a way that the density of oxygen precipitate increases in accordance as the concentration of nitrogen increases. This is because the nitrogen doping results in forming a stable oxygen precipitate nucleus even at a high temperature in a substrate and this nucleus is not eliminated during the epitaxial growth. The epitaxial wafer with oxygen precipitate nuclei in the substrate gives rise to oxygen precipitates when subjected to a heat treatment in subsequent device processing. The number of oxygen precipitate nuclei stable even at a high temperature depends on the concentration of nitrogen. Thus, the density of oxygen precipitate increases in accordance as the concentration of nitrogen increases. Since the density of oxygen precipitate tends to exceed $1 \times 10^9$ precipitates/$cm^3$ when the concentration of nitrogen is increased above $5 \times 10^{14}$ atoms/$cm^3$, the gettering ability for such heavy metals as Fe, Ni, and Cu can be secured even in a heat treatment of low-temperature device processing where the highest temperature is not higher than 1100° C.

As a result of a survey conducted concerning the radial direction distribution of oxygen precipitate in an epitaxial wafer using a nitrogen-doped base plate as a substrate, it has been found that a region in which the density of oxygen precipitate becomes smaller than in the environment thereof exists in an annular area in the substrate plane of the wafer. In the profile of the density of oxygen precipitate, this region drops down like a valley. The region having the density of oxygen precipitate drop down in this manner will be referred to as a "precipitate valley region" herein below.

Figure 4A:
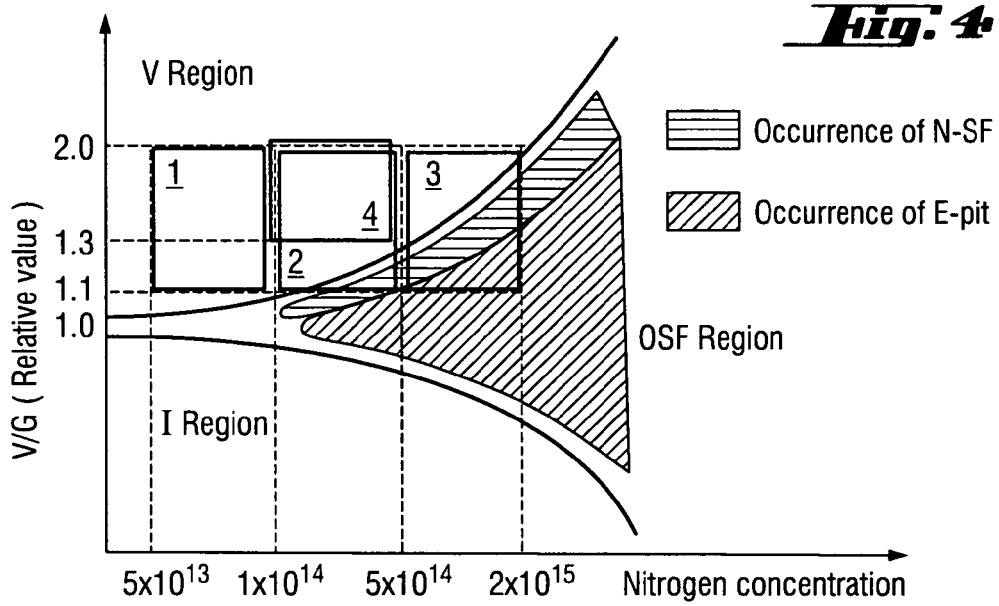
FIG. 4 (a) is a graph showing the relation between the nitrogen concentration and the V/G and (b) is a chart showing the occurrence of N-SF and E-pit in the radial direction in a substrate plane for different growth condition regions.
Figure 4B:
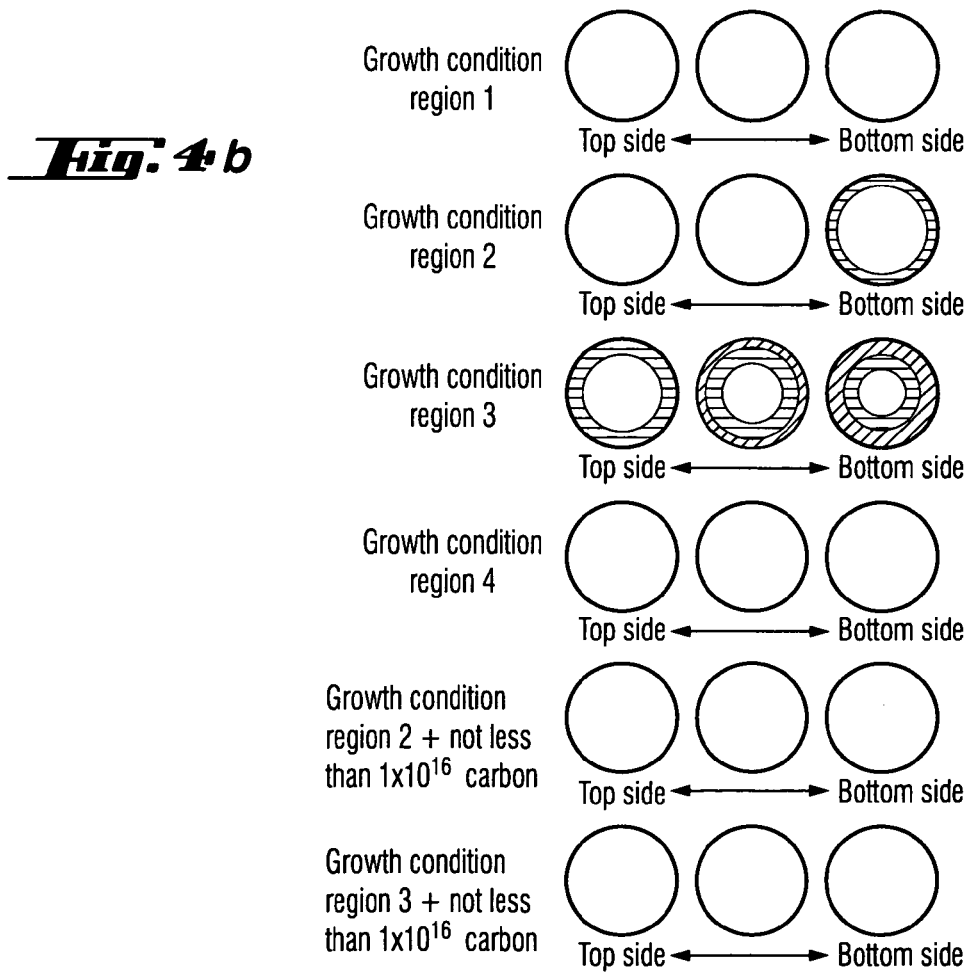

By a detailed survey of the relation between the precipitate valley region of an epitaxial wafer and the fault region of a substrate, it has been ascertained that this precipitate valley region has a close relation with the defect region of a base plate as shown in FIG. 5. To be specific, the precipitate valley region of the epitaxial wafer occurs at a portion corresponding to the V region boundary of the substrate, with slight extension into the V region and the OSF region. FIG. 5 (a) is a graph showing the relation between nitrogen concentration and V/G, providing that the growth condition regions 1 to 4 in the graph are the same regions as in FIG. 4. FIG. 5 (b) is a diagram showing the defect distribution in the substrate plane in the radial direction in a base plate, the existence of an epi-layer defect (with ○ denoting absence of defect and x denoting presence of defect (the same applies to the following drawings 7(b) and 8(b))), whether the density of oxygen precipitate exceeds $10^9/cm^3$ or not (○ denoting a density falling short of $10^9/cm^3$ and x denoting a density exceeding $10^9/cm^3$ (the same applies to the following drawings)), and whether the radial direction dispersion of the density of oxygen precipitate is not more than 0.5 or not (○ denoting a dispersion falling short of 0.5 and x denoting a dispersion exceeding 0.5 (the same applies to the following drawings)).

FIG. 6 is a graph illustrating the radial direction distribution of voids and the radial direction distribution of oxygen precipitate; (a) is a graph showing the relation of nitrogen concentration and V/G and (b) is a graph showing the results of the measurement of densities of voids sized 50 to 150 nm in the direction of a radius of a base plate found separately in the regions A, B, and C shown in (a).

In the graph of (a), the A region has a nitrogen concentration of $5 \times 10^{13}$ atoms/$cm^3$ and a V/G (relative value) of 1.1 to 2.0, the B region has a nitrogen concentration of $5 \times 10^{14}$ atoms/$cm^3$ and a V/G (relative value) of 1.1 to 2.0, and the C region has a nitrogen concentration of $5 \times 10^{15}$ atoms/$cm^3$ and a V/G (relative value) of 1.1 to 2.0.

As diagrammed, the precipitate valley region has been found to be the region in a substrate wherein voids sized 50 to 150 nm are present at densities in the range of $10^4$ to $2 \times 10^5/cm^3$. Here, the void sizes are expressed by diameters of spheres possessing equal volumes as average volumes of the relevant voids. The inner side from the precipitate valley region is a region in which the largest value of void size exceeds 150 nm or the density of voids measuring 50 to 150 nm in size exceeds $2\times10^5/cm^3$. The outer side from the precipitate valley region is a region in which the void size is not more than 50 nm or the density of voids falls short of $10^4/cm^3$. In both the inner side and the outer side from the precipitate valley region, the densities of oxygen precipitate are larger than in the precipitate valley region.

The causes of the phenomenon that the density of oxygen precipitate in the region in which voids measuring 50 to 150 nm in size are present at a density in the range of $10^4$ to $2\times10^5/cm^3$ becomes small as compared with that in the environment thereof has not been ascertained definitely. It is considered that the voids are formed when the atom holes are aggregated in a temperature zone near 1100° C. during the growth of crystal and that the atom holes surviving the aggregation into voids form nuclei of oxygen precipitate in a low temperature zone during the growth of crystal. It is inferred that the region in which the voids measuring 50 to 150 nm are present at a density in the range of $10^4$ to $2\times10^5/cm^3$ is caused by some other mechanism to assume a state having the residual holes in the smallest density.

The fact that the precipitate valley region in the radial direction in a base plate is varied, depending on the nitrogen concentration and the V/G, may be explained by a supposition that the density and the size of the voids are varied in accordance with the nitrogen concentration and the V/G.

The doping of carbon has only a small influence on the distribution of V region and I region in the substrate. The two-dimensional fault region map using nitrogen concentration and V/G as two axes is nearly the same as in the case of doping with only nitrogen. In the epitaxial wafer using a base plate simultaneously doped with nitrogen and carbon, therefore, the same precipitate valley region as shown in FIG. 5 is present just the same notwithstanding that N-SF and E-pit cease to exist.

A study has been pursued regarding the growth condition region of silicon single crystal with a view to producing an epitaxial wafer having a small radial direction variation of oxygen precipitate density while preventing an epi-layer defect.

FIG. 7 is an explanatory drawing illustrating, for a crystal simultaneously doped with nitrogen and carbon, and produced under the condition of low V/G, the relations among the defect region of the crystal, the epi-layer defect, and the in-plane distribution of oxygen precipitate; (a) is a graph showing the relation between nitrogen concentration and V/G and (b) is a diagram showing the defect distribution in a substrate plane in the radial direction part in a base plate, the presence of an epi-layer defect, whether or not the density of oxygen precipitate is less than $10^9/cm^3$, and whether or not the radial direction dispersion of the density of oxygen precipitate is more than 0.5.

First, the range in which the nitrogen concentration is comparatively high and the V/G is comparatively low has been studied. In the illustrated growth condition region 5, which is such a growth condition as answers the description, the nitrogen concentration is $1\times10^{15}$ to $5\times10^{15}$ atoms/cm$^3$ and the V/G (relative value) is 0.7 to 1.2.

The nitrogen-doped base plate grown in the growth condition region 5 is a substrate having the whole surface formed of an OSF region and having the aforementioned precipitate valley region excluded. Since the I region having a small density of oxygen precipitate is also excluded, the oxygen precipitate is made uniform in the radial direction in the base plate. Further, as the nitrogen concentration is not less than $5\times10^{14}$ atoms/cm$^3$, it follows that the density of oxygen precipitate is $1\times10^9$ precipitates/cm$^3$.

By a study pursued regarding the behavior of oxygen precipitate of an epitaxial wafer using the substrate of this quality, it has been found that the radial distribution variation of the density of oxygen precipitate can be suppressed below 0.5 because the oxygen precipitate by a heat treatment is uniformly formed in the radial direction in the base plate.

It has been made clear, however, that the epitaxial wafer using as a substrate a base plate with both nitrogen and carbon dopant and grown in the growth condition region 5 of FIG. 7 tends to form an epi-layer defect even when carbon is doped in an amount of not less than $1\times10^{16}$ atoms/cm$^3$.

The added carbon might be losing its effect of preventing an epi-layer defect because the concentration of nitrogen is heightened and the V/G is lowered as well. In the case of growth condition region 5, however, the upper limit of nitrogen concentration-V/G required for the exclusion of the precipitate valley region and the I region is extremely narrow and the room for suppressing the occurrence of an epi-layer defect by slightly lowering the nitrogen concentration or slightly heightening the V/G is small.

For the purpose of finding such conditions of production that prevent the occurrence of an epi-layer defect despite doping of carbon in an amount of not less than $1\times10^{16}$ atoms/cm$^3$ under the conditions of nitrogen concentration and V/G shown in the growth condition region 5 of FIG. 7, a study has been pursued, aimed at the crystal growth parameters other than nitrogen concentration, carbon concentration, and V/G.

As a result, it has been found that the crystal cooling speed between 1100 and 1000° C. during the growth of crystal is exerting a significant influence on the occurrence of an epi-layer defect.

FIG. 8 is an explanatory drawing illustrating the conditions for producing an epitaxial wafer giving uniform oxygen precipitate; (a) is a graph showing the relation between nitrogen concentration and V/G and (b) is a diagram showing the distribution of faults in the substrate plane in the radial direction in a base plate, the existence of an epi-layer defect, whether or not the density of oxygen precipitate is less than $10^9/cm^3$, and whether the radial direction dispersion of the density of oxygen precipitate is not more than 0.5 or not. The term "NF region" appearing in FIG. 8 refers to a fault region newly discovered between the boundary of the V region and the boundary of the OSF region. This region is not found until the crystal cooling speed between 1100 and 1000° C. during the growth of crystal exceeds 4° C./minute and does not allow presence of OSF or void.

The growth conditions answering this description are such conditions that nitrogen concentration and V/G fall in the ranges belonging in the growth condition region 5 (the same as the growth condition region 5 of FIG. 7) and the crystal cooling speed between 1100 and 1000° C. during the growth of crystal exceeds 4° C./minute. Under these growth conditions, the epitaxial wafer, which uses as a substrate a nitrogen- and carbon-doped base plate having a carbon concentration of not less than $1\times10^{16}$ atoms/cm$^3$, has the radial distribution variation of the density of oxygen precipitate restrained below 0.5 and the concentrations of such epi-layer defects as N-SF and E-pit suppressed below 0.05 occurrences/cm$^2$. Incidentally, the crystal cooling speed is calculated as V×G from the average temperature gradient [° C./mm] in the direction of the axis of crystal growth and the crystal pulling speed V [mm/min].

It has been found that if the crystal cooling speed falls short of 4° C./minute, N-SF or E-pit will occur at a concentration exceeding 0.05 occurrences/cm$^2$ even when the carbon concentration exceeds 1×10$^{16}$ atoms/cm$^3$.

The fault that gives rise to the N-SF or E-pit is presumed to be a crystal fault existing in the OSF region of the base plate. At the present stage, it is inferred that the fault giving rise to the occurrence of an N-SF is a minute void and the origin of the occurrence of E-pit is a dislocation loop derived from oxygen precipitate. It is inferred that these faults are formed in a temperature zone of 1100 to 1000° C. during the growth of crystal. It is surmised that when the temperature zone of 1100 to 1000° C. during the growth of crystal is rapidly cooled, the cooling coupled with the effect of carbon enables prevention of the occurrence of N-SF or E-pit because the formation of the originating defect of N-SF or E-pit is suppressed Meantime, it has been found that the crystal cooling temperature between 1100 and 1000° C. during the growth of crystal greater than 4° C./minute exerts an influence on the radial direction distribution of oxygen precipitate. To be specific, when the crystal cooling speed between 1100 and 1000° C. is fixed at 4° C., the boundary position of the OSF region is not changed and the boundary of the V region is shifted toward low nitrogen and high V/G sides as noted by comparing FIG. 7 and FIG. 8. Consequently, the precipitate valley region is also shifted toward low nitrogen and high V/G sides. As a result, it has been made clear that the ranges of nitrogen concentration and V/G for the desired radial direction distribution of oxygen precipitate are expanded toward low concentration and high V/G sides. That is, both a substrate grown in the growth condition region 5 and having an OSF region throughout the whole surface, and also a substrate grown in the growth condition region 6 and 7, containing an NF region besides an OSF region, may be used to produce an epitaxial wafer wherein the radial direction dispersion of the density of oxygen precipitate falls below 0.5 and the concentrations of such epi-layer defects as N-SF and E-pit both fall below 0.05 occurrences/cm$^2$.

Since the range of nitrogen concentration is widened toward the low nitrogen side, the density of oxygen precipitate can be extensively controlled in conformity with the demand from a device user. Since the pulling speed V can be further heightened in consequence of enlarging the V/G toward the high V/G side, the productivity of silicon single crystal can be enhanced.

The range of V/G in which the radial direction dispersion level of the density of oxygen precipitate falls below 0.5 is between the lower side boundary of the precipitate valley region and the boundary of the I region as shown in FIG. 8. By synthesizing various test results, the range of V/G mentioned above is expressed as a function of the nitrogen concentration. That is, the upper limit of the value of V/G [mm$^2$/° C. min] is 1.4exp(6.2×10$^{-16}$×nitrogen concentration [atoms/cm$^3$])×(V/G) crit and the lower limit of the value of V/G [mm$^2$/° C. min] is 1.0exp(-7.1×10$^{-16}$×nitrogen concentration [atoms/cm$^3$])×(V/G) crit (providing that the term (V/G) crit denotes the V/G value of the part corresponding to the boundary between the V region and the I region in silicon single crystal with no nitrogen doped).

In the growth condition regions 6 and 7 of FIG. 8, the radial direction distribution of oxygen precipitate is uniform because they do not include the precipitate valley region notwithstanding that part of the crystal deviates from the OSF region. It may be safely concluded that the radial direction distribution of oxygen precipitate has no bearing on the distribution of the OSF region. Incidentally, the growth condition region 6 has nitrogen concentration of 5×10$^{14}$ to 2×10$^{15}$ atoms/cm$^3$ and V/G (relative value) of 1.1 to 1.8 and the growth condition region 7 has nitrogen concentration of 1×10$^{15}$ to 5×10$^{15}$ atoms/cm$^3$ and V/G (relative value) of 1.1 to 1.8

According to the conventional knowledge, Patent Document 5 (JP-A 2000-331933) and Patent Document 6 (JP-A 2003-218120) have both discussed the relation between the fault region and the distribution of the density of oxygen precipitate only in relation to the OSF region. Thus, they appear to assume that the OSF region is to be controlled for the purpose of controlling the radial direction distribution of oxygen precipitate. From the present test results, however, it has been found with new research that a significant factor for the purpose of controlling the radial direction distribution of oxygen precipitate resides not in controlling the OSF region but in controlling the precipitate valley region attendant on the distribution of V region.

The crystal cooling speed in the temperature zone of 1100 to 1000° C. during the crystal growth by the CZ method leads to shifting the precipitate valley region as shown in FIG. 8. The cause for this shift may be surmised as follows. The supersaturated atom holes drawn in through the solid-liquid interface during the crystal growth are aggregated and converted into voids in the neighborhood of 1100° C.

When the crystal cooling speed between 1100 and 1000° C. is high, the voids assume a small size because the time allowing aggregation of atom holes is not sufficient. As a result, the region in which the voids 50 to 150 nm in size are present at a density in the range of 10$^4$ to 2×10$^5$/cm$^3$ as shown in the nitrogen concentration V/G map is shifted.

It is surmised that voids not more than 50 nm in size are present between the V region and the OSF region shown in FIG. 8.

Now, a concrete example of the production of silicon single crystal and the production of an epitaxial wafer will be described below.

The CZ method that consists in pulling a crystal from a melt in a crucible while growing the pulled crystal has been accepted as one way of producing a silicon single crystal. In this method of producing a silicon single crystal, first silicon poly crystal is placed as a raw material in a crucible made of quartz and this raw material is melted with a heater encircling them (the heater and the inner components such as a heat insulating member will be collectively referred to as a "hot zone"). Then, a seed crystal is lowered from above the melt in the crucible and brought into contact with the surface of the melt. When the seed crystal is pulled upwardly while it is kept in rotation and the pulling speed V thereof is controlled, it is manufactured into a single crystal of a prescribed diameter. As the crystal continues to grow and the silicon melt continues to decrease, such conditions of crystal growth as thermal conduction and fluidity in the silicon melt continue to vary. The actual crystal production process adopts various contrivances for the purpose of fixing such environmental conditions to the fullest possible extent and stabilizing the crystal growth. Generally, for the purpose of fixing the position of the surface of the silicon melt relative to the heater during the course of pulling the crystal, for example, the position of the crucible is elevated proportionately to the weight of the crystal that has been pulled. The change of the condition of thermal conduction on the crystal side during the growth of crystal is extremely small as compared with that on the melt side. This change generally depends on the structure of the oven and the hot zone structure in the oven, and is slowly varied in accordance with the length of crystal.

The temperature gradient G of the phase boundary of the crystal growth is generally not uniform in the radial direction in the crystal. The crystal side temperature gradient in the phase boundary of the growth of crystal is larger in the outer peripheral part of the crystal than in the central part of the crystal. This is because the lateral face or side surface of the crystal is cooled more by the radiation cooling at the lateral face of crystal. For this reason, the V/G is lower in the outer peripheral part of crystal even at the same pulling speed V and the OSF region forming the base plate origin of an epi-layer defect is liable to occur in the outer peripheral part of crystal. Incidentally, the crystal side temperature gradient G in the direction of pulling the crystal on the phase boundary of the crystal growth has been rigorously determined by repeating such an experiment as actually implementing crystal growth with a thermocouple inserted into the crystal.

The V/G of the phase boundary of crystal growth and the crystal cooling speed between 1100 and 1000° C. during the crystal growth can be controlled by varying one or both of the value of G in the solid-liquid interface and the value of G in the temperature zone of 1100 to 1000° C. For the purpose of controlling these two G values independently, the structure of the pulling oven must be changed.

The pulling speed must be lowered in order to lower the value of V/G. This decrease of the pulling speed inevitably results in lowering the crystal cooling speed between 1100 and 1000° C. during the crystal growth. For the purpose of decreasing the value of V/G of the phase boundary of the crystal growth and also increasing the crystal cooling speed between 1100 and 1000° C. during the crystal growth, such a special measure as enhancing the cooling ability of a thermal shield plate so disposed as to encircle or surround the crystal, for example, is required.

For the purpose of producing a nitrogen-doped CZ-silicon single crystal, nitrogen gas may be introduced into the raw material during melting or a nitride may be deposited on a silicon base plate by, e.g., the CVD technique to be included in the raw material during melting, among other techniques. A carbon-doped CZ-Si crystal may be produced by, for example, including carbon powder in the raw material during melting. The segregation coefficient k, i.e., the ratio of the impurity drawn into the crystal after solidification with respect to the concentration in the melt, is $7 \times 10^4$ in the case of nitrogen and 0.06 in the case of carbon (W. Zulehner and D. Huber, Crystal Growth, Properties and Applications, p. 28, Springer-Verlag, New York, 1982).

The concentration of the nitrogen drawn from the melt into the crystal is expressed by the following formula using the solidification ratio, g=(weight of crystallized silicon)/(initial weight of melt), of the crystal at that time.

(Concentration of nitrogen in crystal)=$k \times$(Concentration of nitrogen in initial melt)$\times (1-g)^{k-1}$ Since this relation is retained practically constant without reference to such conditions as the structure and the pulling speed of the pulling oven, the concentration of nitrogen in the crystal can be controlled nearly uniquely or exclusively by the concentration of nitrogen in the initial melt. The segregation coefficients k of nitrogen and carbon do not influence each other even when nitrogen and carbon are simultaneously doped. Thus, the concentration of nitrogen and the concentration of carbon can be controlled by utilizing the coefficients mentioned above.

Incidentally, in the production of silicon single crystal by the CZ method, the crucible uses quartz as its raw material. Since this quartz crucible melts little by little into the silicon melt, oxygen is present in the silicon melt. The oxygen dissolving out of the quartz crucible moves by the flow and the diffusion of the silicon melt and mostly evaporates as SiO gas from the surface of the melt. Part of the oxygen is drawn into the crystal. The oxygen drawn in at a high temperature is supersaturated while the crystal is cooled, subjected to aggregation, and caused to form minute oxygen clusters while the crystal is cooling. These oxygen clusters serve as precipitate nuclei, which are precipitated as SiOx while the device manufactured from a silicon single crystal wafer is undergoing a heat treatment and are eventually become oxygen precipitates.

The finished silicon single crystal (ingot) is manufactured into a substrate for use in an epitaxial wafer. Generally, a base plate is produced by a process that comprises slicing the silicon single crystal by the use of a wire saw or an inner blade slicer, and subjecting each of the resultant slices to the steps of chamfering, etching, and mirror polishing. When an extra step of heat treatment aimed at promoting oxygen precipitation or eliminating defects is added, generally this step of heat treatment is performed subsequent to the process mentioned above. In the case of a substrate with nitrogen and carbon dopant as contemplated by this disclosure, however, the substrate may be produced by the same process as is used for the ordinary silicon base plate without requiring this extra step.

An epitaxial layer is deposited on the surface of the substrate that has been finished as described above. A device for vapor phase growth implements the process of epitaxial growth (epi-deposition). Generally the substrate is heated in an atmosphere of hydrogen gas to a prescribed temperature range (commonly in the range of 900 to 1200° C.) prior to the vapor phase growth, subsequently etched as with a gas containing hydrogen chloride for several minutes, subjected to removal of surface contamination and activation of base plate surface, and thereafter a silane-based gas is used to grow on the surface thereof an epitaxial thin film.

Though the epi-film thickness is not particularly specified, it is generally preferred to exceed 0.5 μm in view of the controllability of the film thickness. If the epi-film thickness falls short of 0.5 μm, the accomplishment of uniform radial direction film thickness will be rendered difficult. The epi-film thickness is preferred to be not more than 20 μm in view of the throughput. If the epi-film thickness exceeds 20 μm, the result is that the process of epi-deposition may be more than 30 minutes at a sacrifice of throughput productivity. Such conditions are generally considered impractical. The existing, commercially-available devices, which carry out the process piece by piece, use a lamp for heating so as to shorten the process time as much as possible and limit the time required for raising and lowering the temperature to about several minutes. In the case of the ordinary base plate without added nitrogen, since the oxygen precipitate nuclei formed during the growth of crystal are substantially eliminated during the rapid temperature increase of this process of epi-deposition, the epitaxial wafer subsequent to the epi-deposition cannot induce oxygen precipitation even during the course of the heat treatment required as the device.

The oxygen precipitate nuclei formed in the nitrogen-doped base plate that will be used as a substrate have been thermally stabilized by the effect of nitrogen and, therefore, are not eliminated during the rapid temperature increase in the process of epi-deposition. The extra process of heat treatment aimed at promoting oxygen precipitation or eliminating a fault may be optionally performed in this process of epi-deposition. In this case, the heat treatment is carried out at a prescribed temperature for a prescribed time before or after etching with a gas containing hydrogen chloride. Subsequently, the step of growing an epitaxial thin film on the surface of a substrate by the use of a silane-based gas is initiated. The addition of such an extra step as this, however, increases the time for the whole step of epi-deposition and lowering the productivity and eventually leads to adding to the cost of production. As regards this point, the base plate with added nitrogen and carbon as contemplated by this disclosure does not require this step, but preferably uses the same epi-deposition condition as the ordinary base plate.

EXAMPLES

Now, examples of this disclosure will be explained below.

In the examples, the device for producing silicon single crystal is adapted to produce the silicon single crystal by the ordinary CZ method, and consists of the first pulling oven capable of typical pulling speeds and the second pulling oven adapted for additional cooling by a thermal shield plate for the purpose of heightening the cooling speed between 1100 and 1000° C. In embodying this disclosure, these pulling ovens do not need to be particularly limited to the examples herein but were only required to be capable of fulfilling the conditions of growth contemplated by this disclosure.

The silicon single crystal grown by the use of this device was a conduction type: p type (boron-doped) and crystal diameter of 8 inches (200 mm).

The addition of nitrogen was implemented by adding a base plate having a nitride film adhering thereto into a silicon melt. The addition of carbon was accomplished by adding carbon powder into the silicon melt.

Incidentally, the relative V/G value was defined as follows. In a pulling oven having the same construction as the pulling oven that had pulled the relevant nitrogen-added silicon single crystal ingot (hereinafter referred to as "nitrogen-doped crystal"), a silicon single crystal ingot having neither nitrogen nor carbon doped was pulled at a varying pulling speed V and tested for in-plane distribution of dislocation pits by the method which will be specifically described herein below to determine the boundary position of the I region. When the pulling speed was lowered, for example, the wafer edge side became the I region and produced dislocation pits. In that case, the relevant wafer was tested for the in-plane distribution of dislocation pits and the position at which the density of dislocation pits was lower than 10 occurrences/cm² was designated the boundary of the I region. The relative V/G value of a nitrogen-doped crystal pulled in the pulling oven of the same construction was determined as (V/G)/(V/G) crit, the V/G value at that position is designated as (V/G) crit, and, to be specific, V/G equals (V/G) crit when the value of relative V/G is 1.

Samples of a crystal without nitrogen dopant were pulled in the first pulling oven and the second pulling oven to find the values of relative V/G and prepare a nitrogen concentration-V/G map.

As regards the cooling speed between 1100 and 1000° C. during the growth of crystal, the value of V×G2, wherein G2 denotes the smallest of the values [° C./mm] of temperature gradient in the range of 1100 to 1000° C. in the direction of the axis of crystal growth, was computed and presented as the representative value.

Epitaxial wafers were prepared by slicing base plates (silicon wafers) from the same part of the single crystal, mirror polishing the base plates to obtain substrates, and having a silicon single crystal layer (epi-layer) deposited severally on the substrates by the epitaxial method.

The epi-layer manifested a specific resistance of 8 to 12 Ωcm and measured 5 µm in film thickness. The specific resistance was measured by the four point probe method.

The nitrogen concentration was determined by extracting a sample from the epitaxial wafer subsequent to the epi-layer deposition, subjecting the sample to a 20 µm polish with the object of stripping the epi-layer of the surface, and examining the sample with a secondary ion mass spectrometer (SIMS).

The carbon concentration was determined by examining the epitaxial wafer resulting from the epi-layer deposition by the infrared absorption method (Fourier Transform Infrared or FTIR) and calculated by using the concentration conversion coefficient adopted by the Japanese Electronic Industry Development Association. The carbon concentration of a base plate manifesting such a low specific resistance as to be below the lower detection limit of the FTIR was determined by using the SIMS.

In the V region of the substrate, excessive atomic vacancies were introduced from the solid-liquid interface during crystal growth, resulting in the generation of voids. Thus, the V region of the substrate could be specifically defined by the density of these voids.

The voids in the substrate were examined by determining the radial direction distribution of voids in a base plate by the use of an LSTD scanner (made by Mitsui Mining And Smelting Company, Limited and sold under the product code of MO-6), which is a commercially available device for defect evaluation. This MO-6 emitted a visible light laser at the Brewster angle and detected a scattered image of p-polarization as a defect image with a camera disposed in the vertical direction. Since the laser permeated the base plate only to a depth of 5 µm from the surface, the device can only evaluate the defects existing in the base plate within a depth of 5 µm from the surface. Prior to the determination, the detection sensitivity was so adjusted that voids measuring not less than 50 nm in size when converted into a sphere could be covered by the measurement. The volume density of the voids was calculated from the area density of the voids covered by the measurement and the depth of measurement of 5 µm. The region in which the volume density of voids was not less than $1 \times 10^5/cm^3$ was designated V region.

Meanwhile, the I region of the substrate developed dislocation pits in consequence of the introduction of excess interstitial atoms through the solid-liquid interface during crystal growth. Thus, the I region could be defined by the density of these dislocation pits.

The substrate was surveyed to determine dislocation pits occurring therein by the following method. First, the substrate was etched to a depth of 5 µm with a light etching liquid. The dislocation pits measuring not less than 1 µm in size and occurring on the etched surface in a rhombic shape or streamline shape were counted by observation with an optical microscope. The area density of the dislocation pits was calculated from the area of visual field that was obtained by measuring the dislocation pits at pitches of 10 mm in the radial direction in the base plate. The region in which the density of dislocation pits was not less than 10 occurrences/cm² was designated the I region.

The OSF evaluation of the substrate was carried out by the following method. First, the substrate was subjected to an oxidation treatment at 1100° C. for one hour in an atmosphere of vapor-containing oxygen. Subsequently, it was stripped of an oxide film with hydrofluoric acid and then etched to a depth equivalent to the thickness of an epi-layer with a light etching liquid. The OSF pits that formed on the etched surface in an elliptic shape, a crescent shape, or a bar shape were observed with an optical microscope. The area density of OSF [occurrences/cm²] was determined by scanning the substrate in the direction of diameter of the base plate in a visual field 2.5 mm in diameter with an optical microscope thereby counting OSF pits and dividing the number of OSF pits by the area of observation. The region in which the area density of OSF is not less than 100 occurrences/cm² was designated the OSF region.

Concerning the evaluation in respect of defect region of a substrate doped with both nitrogen and carbon, the substrate of crystal with nitrogen alone and pulled in the same range of nitrogen concentration under the same crystal growth conditions was evaluated and the defect region consequently obtained was directly adopted as the fault region of the substrate doped with both nitrogen and carbon.

The N-SF of the epitaxial wafer subsequent to the epi-deposition was evaluated by the following procedure. First, the epitaxial wafer in the unmodified form was tested for the number and the distribution of foreign particles by using a surface contamination meter made by Tencor Corp. and sold under the product code of "SP1" set to detect foreign particles not less than 0.11 μm in size. Thereafter, the epitaxial wafer was subjected to the SC1 cleaning for removal of foreign particles and again tested for foreign particles with the surface contamination meter. The foreign particles surviving the cleaning were designated the N-SF and these foreign particles in the in-plane part of the base plate were counted. The area density was calculated by dividing the number of N-SF consequently found by the area of measurement.

The E-pit in the epitaxial wafer subsequent to the epi-deposition was evaluated by the following procedure. The evaluation was carried out by etching the epitaxial wafer to a depth equivalent to the thickness of epi-layer with a light etching liquid and counting the pits not less than 1 μm in size produced on the etched surface in a rhombic shape or a streamline shape by the observation with an optical microscope. For the purpose of calculating the density, the observation regions in 1 cm squares were spread all over without a gap in the direction of a diameter of the base plate, the elliptic pits existing therein were counted, the area density in each of the square regions was calculated, and the largest of the values of area densities of elliptic pits in the radial direction part was obtained.

Gate oxide integrity on the epitaxial wafer subsequent to the epi-deposition was evaluated by the following procedure. Numerous poly silicon-MOS capacitors having an electrode surface area of 20 mm² were formed on the epitaxial wafer. The gate oxide film had a thickness of 25 nm. An electric field was applied to the MOS capacitors. The number of MOS capacitors in which the average electric field applied to the gate oxide film when the control current was $1\times10^{-6}$ A/cm² exceeded 11 MV/cm² was found and the ratio of this number was designated as the success rate of the pressure-proof property of oxide film.

The oxygen precipitation property of the epitaxial wafer subsequent to the epi-deposition was evaluated by the following method. First, the base plate subsequent to the epi-deposition was subjected to a single-stage heat treatment at 1000° C. for 16 hours, then cleaved, and tested with a BMD analyzer made by Mitsui Mining And Smelting Company, Limited and sold under the product code of "MO-4" to determine the density of oxygen precipitate in the inner part. The radial direction positions of the measuring points were pitched at 10 mm from the center of the base plate and limited to 10 mm from the edge. The smallest of the values of the density of oxygen precipitate consequently obtained and the degree of radial direction dispersion of the density of oxygen precipitate represented by the following formula were found.

Radial distribution variation of the density of oxygen precipitate=(Maximum value of density of oxygen precipitate−Minimum value of density of oxygen precipitate)/Maximum value of density of oxygen precipitate The results of the evaluation inclusive of those obtained in comparative examples are shown in Table 1 and Table 2.

TABLE 1

| | Nitrogen concentration in base plate (atoms/cm³) | Carbon concentration in base plate (atoms/cm³) | Pulling oven | Specific resistance of substrate (Ωcm) | Pulling speed V (mm/min) | Range of relative V/G value Upper limit Lower limit | $(V/G)_1$ | $(V/G)_2$ | Cooling speed (° C./min) |
|---|---|---|---|---|---|---|---|---|---|
| 1 | 5.0E+14 | 1.0E+16 | 2 | 8 | 0.9 | 0.7-1.2 | 0.70 | 1.89 | 4.0 |
| 2 | 1.0E+15 | 1.0E+16 | 2 | 11 | 0.9 | 0.7-1.2 | 0.49 | 2.55 | 4.0 |
| 3 | 5.0E+15 | 1.0E+16 | 2 | 12 | 0.9 | 0.7-1.2 | 0.03 | 28.12 | 4.0 |
| 4 | 5.0E+14 | 1.0E+16 | 2 | 10 | 1.4 | 1.1-1.8 | 0.70 | 1.89 | 6.0 |
| 5 | 1.0E+15 | 1.0E+16 | 2 | 11 | 1.4 | 1.1-1.8 | 0.49 | 2.55 | 6.0 |
| 6 | 5.0E+15 | 1.0E+16 | 2 | 12 | 1.4 | 1.1-1.8 | 0.03 | 28.12 | 6.0 |
| 7 | 5.0E+14 | 1.0E+17 | 2 | 11 | 0.9 | 0.7-1.2 | 0.70 | 1.89 | 4.0 |
| 8 | 1.0E+15 | 1.0E+17 | 2 | 9 | 0.9 | 0.7-1.2 | 0.49 | 2.55 | 4.0 |
| 9 | 5.0E+15 | 1.0E+17 | 2 | 8 | 0.9 | 0.7-1.2 | 0.03 | 28.12 | 4.0 |
| 10 | 5.0E+14 | 1.0E+16 | 2 | 0.015 | 1.2 | 0.7-1.2 | 0.70 | 1.89 | 4.0 |
| 11 | 1.0E+15 | 1.0E+16 | 2 | 0.016 | 1.3 | 0.7-1.2 | 0.49 | 2.55 | 4.0 |
| 12 | 5.0E+15 | 1.0E+16 | 2 | 0.014 | 1.2 | 0.7-1.2 | 0.03 | 28.12 | 4.0 |
| 1 | 1.0E+13 | 0.0E+00 | 1 | 10 | 1 | 1.1-2.0 | | | 2.0 |
| 2 | 1.0E+14 | 0.0E+00 | 1 | 9 | 1 | 1.1-2.0 | | | 2.0 |
| 3 | 4.0E+14 | 0.0E+00 | 1 | 11 | 1 | 1.1-2.0 | | | 2.0 |
| 4 | 1.0E+15 | 0.0E+00 | 1 | 8 | 1 | 1.1-2.0 | | | 2.0 |
| 5 | 5.0E+15 | 0.0E+00 | 1 | 8 | 1 | 1.1-2.0 | | | 2.0 |
| 6 | 1.0E+15 | 0.0E+00 | 1 | 11 | 0.6 | 0.7-1.2 | | | 1.2 |
| 7 | 5.0E+15 | 0.0E+00 | 1 | 12 | 0.6 | 0.7-1.2 | | | 1.2 |
| 8 | 5.0E+14 | 1.0E+16 | 1 | 9 | 0.6 | 0.7-1.2 | | | 1.2 |
| 9 | 1.0E+15 | 1.0E+16 | 1 | 8 | 0.6 | 0.7-1.2 | | | 1.2 |
| 10 | 5.0E+15 | 1.0E+16 | 1 | 9 | 0.6 | 0.7-1.2 | | | 1.2 |
| 11 | 5.0E+14 | 1.0E+17 | 1 | 10 | 0.6 | 0.7-1.2 | | | 1.2 |
| 12 | 1.0E+15 | 1.0E+17 | 1 | 11 | 0.6 | 0.7-1.2 | | | 1.2 |

TABLE 1-continued

| | Nitrogen concentration in base plate (atoms/cm³) | Carbon concentration in base plate (atoms/cm³) | Pulling oven | Specific resistance of substrate (Ωcm) | Pulling speed V (mm/min) | Range of relative V/G value Upper limit Lower limit | $(V/G)_1$ | $(V/G)_2$ | Cooling speed (° C./min) |
|---|---|---|---|---|---|---|---|---|---|
| 13 | 5.0E+15 | 1.0E+17 | 1 | 9 | 0.6 | 0.7-1.2 | | | 1.2 |
| 14 | 5.0E+14 | 1.0E+16 | 2 | 8 | 0.8 | 0.7-1.2 | 0.70 | 1.89 | 4.0 |
| 15 | 5.0E+14 | 1.0E+16 | 2 | 8 | 1.9 | 1.5-1.2 | 0.70 | 1.89 | 8.0 |

$(V/G)_1$: 1.0 exp (−7.1 × 10⁻¹⁶ × nitrogen concentration [atoms/cm³])
$(V/G)_2$: 1.4 exp (6.2 × 10⁻¹⁶ × nitrogen concentration [atoms/cm³])

TABLE 2

| | Density of N-SF (cm⁻²) | Density of E-pit (cm⁻²) | Success rate of pressure-proof property of oxide film (%) | Smallest value of density of precipitate (cm⁻³) | In-plane dispersion of density of precipitate |
|---|---|---|---|---|---|
| 1 | 0 | 0 | 96 | 3.0E+09 | 0.2 |
| 2 | 0 | 0 | 97 | 5.0E+09 | 0.1 |
| 3 | 0 | 0 | 99 | 1.0E+10 | 0.1 |
| 4 | 0 | 0 | 99 | 2.0E+09 | 0.1 |
| 5 | 0 | 0 | 98 | 3.0E+09 | 0.2 |
| 6 | 0 | 0 | 99 | 5.0E+09 | 0.1 |
| 7 | 0 | 0 | 98 | 2.6E+09 | 0.1 |
| 8 | 0 | 0 | 97 | 5.4E+09 | 0.1 |
| 9 | 0 | 0 | 97 | 1.5E+10 | 0.1 |
| 10 | 0 | 0 | 99 | 1.3E+10 | 0.1 |
| 11 | 0 | 0 | 98 | 1.2E+10 | 0.1 |
| 12 | 0 | 0 | 99 | 1.5E+10 | 0.0 |
| 1 | 0 | 0 | 98 | 5.0E+07 | 0.2 |
| 2 | 0 | 0 | 97 | 4.0E+08 | 0.3 |
| 3 | 0 | 0 | 100 | 5.0E+08 | 0.7 |
| 4 | 0.06 | 15 | 86 | 2.0E+09 | 0.8 |
| 5 | 0.6 | 30 | 74 | 5.0E+09 | 0.2 |
| 6 | 0.7 | 43 | 56 | 1.0E+10 | 0.3 |
| 7 | 0.8 | 51 | 34 | 2.0E+10 | 0.2 |
| 8 | 0.07 | 0.1 | 92 | 1.0E+09 | 0.3 |
| 9 | 0.12 | 1 | 87 | 3.0E+09 | 0.2 |
| 10 | 0.3 | 20 | 78 | 6.0E+09 | 0.3 |
| 11 | 0.08 | 0.2 | 89 | 1.0E+09 | 0.2 |
| 12 | 0.09 | 2 | 56 | 3.0E+09 | 0.2 |
| 13 | 0.15 | 16 | 34 | 6.0E+09 | 0.3 |
| 14 | 0 | 4 | 68 | 2.3E+07 | 1.0 |
| 15 | 0 | 0 | 98 | 5.0E+09 | 0.7 |

The base plates satisfying the conditions, i.e. oxygen concentration of not less than 5×10¹⁴ atoms/cm³, carbon concentration of not less than 1×10¹⁶ atoms/cm³, and range of relative V/G value of not less than 1.0 exp (−7.1×10⁻¹⁶×nitrogen concentration [atoms/cm³]) and not more than 1.4 exp (6.2× 10⁻¹⁶×nitrogen concentration [atoms/cm³]) and manifesting a cooling speed of not less than 4° C./minute between 1100 and 1000° C., produced, subsequent to the epi-deposition, epitaxial wafers that exhibited N-SF of not more than 0.05 occurrences/cm² and E-pit of not more than 0.05 occurrences/ cm² and showed ratios of acceptance of the withstanding pressure of oxide film of not less than 95%. Thus, the epi-layer was found to excel in quality.

Further, the oxygen precipitates showed the minimum values of the density of oxygen precipitate of not less than 1×10⁹ precipitates/cm³ and the radial distribution variation of the density of oxygen precipitate of not more than 0.5, indicating that these oxygen precipitates were also excellent in quality. An examination of the in-plane distribution of voids in the base plates of the epitaxial wafers, that were satisfactory in the in-plane distribution of oxygen precipitate as described above, showed that a region in which the density of voids 50 to 150 nm in size was in the range of 10⁴ to 2×10⁵/cm³ was not present in the base plates.

The base plates that manifested nitrogen concentrations falling short of 5×10¹⁴ atoms/cm³ had the smallest values for density of oxygen precipitate, falling short of 1×10⁹ precipitates/cm³, indicating that they were inferior in quality to the other examples.

The base plates satisfying the conditions, i.e. nitrogen concentration of not less than 5×10¹⁴ atoms/cm³, carbon concentration of not less than 1×10¹⁶ atoms/cm³, and range of relative V/G of not less than 1.0 exp (−7.1×10⁻¹⁶×nitrogen concentration [atoms/cm³]) and not more than 1.4 exp (6.2× 10⁻¹⁶×nitrogen concentration [atoms/cm³]), but revealing a cooling speed falling short of 4° C./minute between 1100 and 1000° C. produced N-SF exceeding 0.05 occurrences/cm² and E-pit exceeding 0.05 occurrences/cm² and had a success rate for the pressure-proof property of oxide film falling short of 95%, indicating that the epi-layers were inferior in quality to the other examples.

Such base plates as manifested the largest relative V/G value falling short of 1.0 exp (−7.1×10⁻¹⁶×nitrogen concentration [atoms/cm³]) or the smallest relative V/G value exceeding 1.4 exp (6.2×10⁻¹⁶ nitrogen concentration [atoms/ cm³]) revealed the in-plane dispersion level of the density of oxygen precipitate exceeding 0.5 and, therefore, were inferior in quality to the other examples.

The embodiment and the working examples of this disclosure thereof have been heretofore explained. This disclosure is not restricted to these working examples or the embodiment but may be altered in various ways by any person skilled in the art and is still within the scope of this disclosure. Such altered embodiment and working examples include the technical idea of this disclosure as well. The technical scope of this disclosure, therefore, is decided solely by the claims that can be verified in view of the foregoing explanation.

We claim:
1. A method for production of an epitaxial wafer, the method comprising the steps of:
   growing a silicon single crystal by the Czochralski method with a nitrogen dopant and
   using a V/G between an upper limit of 1.4 exp(6.2×10⁻¹⁶× nitrogen concentration)×(V/G)crit and a lower limit of 1.0 exp(−7.1×10⁻¹⁶×nitrogen concentration)×(V/G) crit, wherein V denotes the pulling speed, G denotes the average temperature gradient from the melting point to 1350° C. in the direction of the crystal growth axis and

(V/G)crit denotes the V/G value for a silicon single crystal without nitrogen dopant that is contiguous to the boundary of V-region and I-region, and using a cooling rate of at least about 4° C./minute between 1100 and 1000° C., and subjecting the growing silicon single crystal to simultaneous doping of nitrogen and carbon at a nitrogen concentration of $5\times10^{14}$ to $5\times10^{15}$ atoms/cm$^3$ and a carbon concentration of $1\times10^{16}$ to $1\times10^{18}$ atoms/cm$^3$;

cutting a substrate from the silicon single crystal; and depositing an epitaxial layer on a surface of the substrate.

* * * * *